United States Patent
Ganga et al.

(10) Patent No.: US 7,873,892 B2
(45) Date of Patent: *Jan. 18, 2011

(54) TECHNIQUES TO PERFORM FORWARD ERROR CORRECTION FOR AN ELECTRICAL BACKPLANE

(75) Inventors: Ilango S. Ganga, Cupertino, CA (US); Luke Chang, Aloha, OR (US); Andrey Belogolovy, St. Petersberg (RU); Andrei Ovchinnikov, St. Petersberg (RU)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/639,797

(22) Filed: Dec. 16, 2009

(65) Prior Publication Data

US 2010/0095185 A1    Apr. 15, 2010

Related U.S. Application Data

(63) Continuation of application No. 11/325,765, filed on Jan. 4, 2006, now Pat. No. 7,676,733.

(51) Int. Cl.
*H03M 13/00* (2006.01)

(52) U.S. Cl. .................. 714/752; 714/786; 714/799; 714/4

(58) Field of Classification Search .............. 714/4, 714/752, 775, 776, 789, 821
See application file for complete search history.

(56) References Cited

U.S. PATENT DOCUMENTS

| | | | |
|---|---|---|---|
| 6,999,678 B2 * | 2/2006 | Corbeil et al. | 398/5 |
| 7,076,724 B2 * | 7/2006 | Cole et al. | 714/784 |
| 7,085,987 B2 * | 8/2006 | Hewitt et al. | 714/755 |
| 7,130,354 B1 * | 10/2006 | Murphy et al. | 375/261 |
| 7,284,184 B2 | 10/2007 | Gallezot et al. | |
| 7,343,540 B2 | 3/2008 | Khermosh et al. | |
| 7,469,297 B1 * | 12/2008 | Kostoff et al. | 709/236 |
| 7,499,500 B2 | 3/2009 | Page | |
| 7,546,510 B2 * | 6/2009 | Dror et al. | 714/755 |
| 7,570,720 B2 * | 8/2009 | Gaddam et al. | 375/341 |
| 7,729,617 B2 * | 6/2010 | Sheth et al. | 398/135 |
| 2005/0149822 A1 | 7/2005 | Lee et al. | |
| 2006/0098686 A1 | 5/2006 | Takakuwa et al. | |
| 2007/0157060 A1 | 7/2007 | Ganga et al. | |

* cited by examiner

*Primary Examiner*—Esaw T Abraham
(74) *Attorney, Agent, or Firm*—Caroline M. Fleming

(57) ABSTRACT

Techniques to perform forward error correction for an electrical backplane are described. An apparatus comprises a physical layer unit having a forward error correction sublayer to perform forward error correction using a single bit to represent a two bit synchronization header.

19 Claims, 19 Drawing Sheets

| | 64 bit payload Word 0 | $T_1$ | 64 bit payload Word 1 | $T_2$ | 64 bit payload Word 2 | $T_3$ | 64 bit payload Word 3 |
|---|---|---|---|---|---|---|---|
| $T_0$ | | | | | | | |
| $T_4$ | 64 bit payload Word 4 | $T_5$ | 64 bit payload Word 5 | $T_6$ | 64 bit payload Word 6 | $T_7$ | 64 bit payload Word 7 |
| $T_8$ | 64 bit payload Word 8 | $T_9$ | 64 bit payload Word 9 | $T_{10}$ | 64 bit payload Word 10 | $T_{11}$ | 64 bit payload Word 11 |
| $T_{12}$ | 64 bit payload Word 12 | $T_{13}$ | 64 bit payload Word 13 | $T_{14}$ | 64 bit payload Word 14 | $T_{15}$ | 64 bit payload Word 15 |
| $T_{16}$ | 64 bit payload Word 16 | $T_{17}$ | 64 bit payload Word 17 | $T_{18}$ | 64 bit payload Word 18 | $T_{19}$ | 64 bit payload Word 19 |
| $T_{20}$ | 64 bit payload Word 20 | $T_{21}$ | 64 bit payload Word 21 | $T_{22}$ | 64 bit payload Word 22 | $T_{23}$ | 64 bit payload Word 23 |
| $T_{24}$ | 64 bit payload Word 24 | $T_{25}$ | 64 bit payload Word 25 | $T_{26}$ | 64 bit payload Word 26 | $T_{27}$ | 64 bit payload Word 27 |
| $T_{28}$ | 64 bit payload Word 28 | $T_{29}$ | 64 bit payload Word 29 | $T_{30}$ | 64 bit payload Word 30 | $T_{31}$ | 64 bit payload Word 31 |
| 32 parity bits | | | | | | | |

TECHNIQUES TO PERFORM FORWARD ERROR CORRECTION FOR AN ELECTRICAL BACKPLANE

RELATED APPLICATION(S)

This application is a continuation of U.S. patent application Ser. No. 11/325,765 filed on Jan. 4, 2006, which issued as U.S. Pat. No. 7,676,733 on Mar. 9, 2010. The entire teaching of the above application is incorporated herein by reference.

BACKGROUND

High speed communication systems capable of higher throughput data rates are emerging. For example, Gigabit Ethernet networks may communicate information at 10 gigabits-per-second (Gbps) or higher. High speed channels typically realize a corresponding increase in error rates. Techniques such as forward error correction may be used to decrease the error rates. Such techniques, however, may require a communication system to communicate additional overhead in the form of error correcting information. The additional overhead may decrease the effective throughput for a communication system.

BRIEF DESCRIPTION OF THE DRAWINGS

FIG. 3 illustrates one embodiment of a forward error correcting block.

DETAILED DESCRIPTION

Various embodiments may be generally directed to forward error correction (FEC) techniques. In particular, various embodiments may be directed to FEC techniques for Ethernet operation over electrical backplanes, also referred to as "Backplane Ethernet." In one embodiment, for example, an apparatus may comprise a physical layer unit having a forward error correction sublayer to perform FEC using a single bit to represent a two bit synchronization header. Error detection and/or correction information may replace the additional bit previously used for the two bit synchronization header. Stated differently, the FEC sublayer compresses the two bit synchronization header to a single bit, and uses one of the synchronization bits of the two bit synchronization header to send error detection or correction information. In this manner, the physical layer unit may use FEC techniques to decrease bit error rates (BER) without necessarily increasing communication overhead. Other embodiments are described and claimed.

Figure 1:
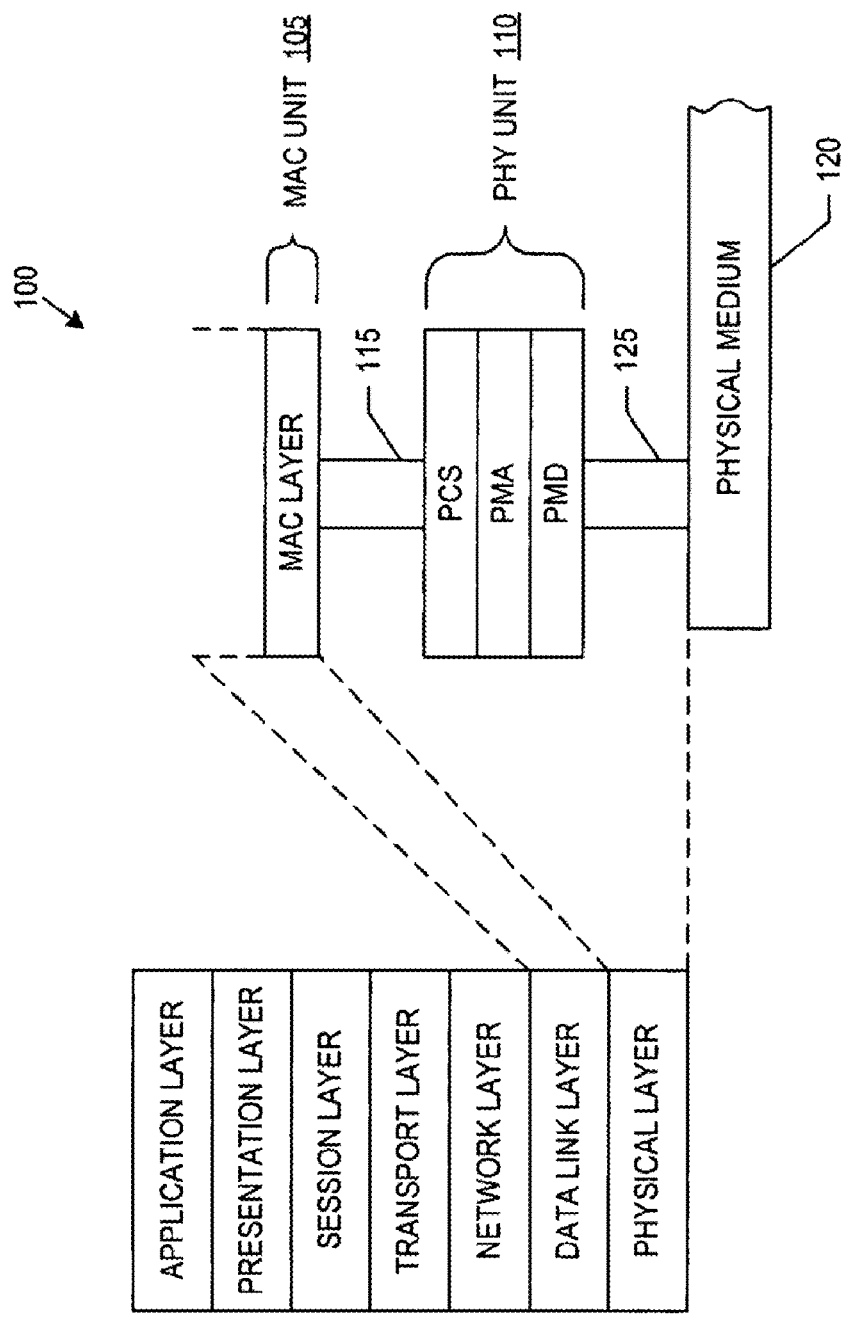
FIG. 1 illustrates one embodiment of a network interface.

FIG. 1 illustrates one embodiment of a network interface. FIG. 1 illustrates a network interface 100. Network interface 100 may allow a device to communicate information over a network. In various embodiments, network interface 100 may represent any network interface suitable for use with a number of different Ethernet techniques as defined by the Institute of Electrical and Electronics Engineers (IEEE) 802.3 series of standards. For example, network interface 100 may comprise a structure arranged to operate in accordance with the IEEE 802.3-2005 standard. The IEEE 802.3-2005 standard defines 1000 megabits per second (Mbps) operations (1000BASE-T) using four pair twisted copper Category 5 wire, 10 Gbps operations using fiber cable, and 10 Gbps operations (10GBASE-CX4) using copper twinaxial cable (collectively referred to herein as "Gigabit Ethernet"). More particularly, network interface 100 may have a structure arranged to operate in accordance with the IEEE Standard 802.3-2005 titled "IEEE Standard For Information Technology—Telecommunications and information exchange between systems—Local and metropolitan networks—Specific requirements Part 3: Carrier Sense Multiple Access with Collision Detection (CSMA/CD) Access Method and Physical Layer Specifications, Amendment: Ethernet Operation over Electrical Backplanes," Draft Amendment P802.3ap/Draft 2.1, 2005 ("Backplane Ethernet Specification"). Network interface 100, however, is not necessarily limited to the techniques defined by these standards, and network interface 100 may use other techniques and standards as desired for a given implementation. The embodiments are not limited in this context.

As shown in FIG. 1, network interface 100 may include a media access control (MAC) unit 105 and a physical (PHY) unit 110. In various embodiments, MAC unit 105 and/or PHY unit 110 may be arranged to operate in accordance with one of the Ethernet architectures as previously described, such as the IEEE 802.3-2005 series of standards including the Backplane Ethernet Specification. Although FIG. 1 illustrates network interface 100 with a limited number of elements, it may be appreciated that network interface 100 may include more or less elements in different topologies and still fall within the scope of the embodiments. The embodiments are not limited in this context.

In one embodiment, for example, MAC unit 105 and/or PHY unit 110 may be arranged to operate in accordance with the Backplane Ethernet Specification. Backplane Ethernet combines the IEEE 802.3 MAC and MAC Control sublayers with a family of Physical Layers defined to support operation over a modular chassis backplane. Backplane Ethernet supports the IEEE 802.3 MAC operating at 1000 Mbps and/or 10 Gbps, For 1000 Mbps operation, the family of 1000BASE-X PHY signaling systems is extended to include 1000BASE-KX. For 10 Gbps operation, two PHY signaling systems are defined. For operation over four logical lanes, the 10GBASE-X family is extended to include 10GBASE-KX4. For serial operation, the 10GBASE-R family is extended to include 10 GBASE-KR (e.g., using various serializer/deserializer or "SERDES" techniques). Backplane Ethernet also specifies an Auto-Negotiation function to enable two devices that share a backplane link segment to automatically select the best mode of operation common to both devices.

With reference to the seven-layer Open System Interconnect ("OSI") Reference Model developed by the International Standards Organization ("ISO"), MAC unit 105 implements MAC layer operations. The MAC layer is a sublayer of the data link layer. The data link layer is primarily concerned with transforming a raw transmission facility into a communication line free of undetected transmission errors for use by the network layer. The data link layer accomplishes this task by breaking input data into data frames, transmitting the data frames sequentially, and processing acknowledgement frames. The MAC sublayer provides additional functionality concerned with controlling access to broadcast networks (e.g., Ethernet). In the case of Ethernet architecture, for example, the MAC sublayer may implement a CSMA/CD protocol.

In various embodiments, MAC unit 105 is coupled to PHY unit 110 via a bi-directional link 115 to provide a data path between MAC unit 105 and PHY unit 110. Bi-directional link 115 is often referred to as a Media Independent Interface ("MII"), an xMII in the case of implementations of 100 Mbps or higher, X attachment unit interface ("XAUI") in the case of 10 Gbps implementations, or X fiber interface ("XFI") in the case of dual path 10 Gbps implementations. In one embodiment, for example, bi-directional link 115 may comprise a 10 Gbps MII (XGMII) when MAC unit 105 and/or PHY unit 110 are implemented for serial operations in accordance with 10GBASE-KR as defined by the Backplane Ethernet Specification. Bi-directional link 115 may use a 4-octet wide data path, for example, when implemented as an XGMII bi-directional link. In one embodiment, for example, bi-directional link 115 may comprise a XAUI link where the XGMII from MAC unit 105 is extended through a XGXS sublayer (e.g., XGMII extender sublayer) which provides XGMII on both sides with XAUI used therebetween to extend it. The embodiments are not limited in this context.

In various embodiments, PHY unit 110 implements physical layer operations. The physical layer is primarily concerned with transmitting raw bits over physical medium 120, which may be some form of network. PHY unit 110 is coupled to physical medium 120 via a media dependent interface (MDI) 125. Physical medium 120 may include various communications media, such as an optical fiber, a twisted pair conductor, or the like. In one embodiment, for example, physical medium 120 is a four pair twisted conductor, such as copper, conforming to a Category 5, 6, 7 or the like cable. In the four pair twisted conductor embodiment, PHY unit 110 converts digital data received from MAC unit 105 (e.g., 1000BASE-X or 10 GBASE-X) into analog symbols (e.g., 1000BASE-T or 10 GBASE-T) for transmission over physical medium 120. For example, PHY unit 110 may encode the digital data using Manchester encoding or the like. Physical medium 120 may operate at any number of bandwidths, including 100 Mbps, 1 Gbps, 10 Gbps, and so forth. PHY unit 110 may be connected or coupled to physical medium 120 using any connectors suitable for a given type of communications media, such as an electrical connector, optical connector, and so forth. In one embodiment, for example, PHY unit 110 may be connected or coupled to physical medium 120 to support operation over differential, controlled impedance traces on a printed circuit board with two or more connectors and total length up to at least 1 m in accordance with the Backplane Ethernet Specification. The embodiments are not limited in this context.

In various embodiments, PHY unit 110 may further implement operations for various sublayers of the physical layer, including a physical coding sublayer ("PCS"), a physical medium attachment ("PMA") sublayer, and a physical medium dependent ("PMD") sublayer. In one embodiment, for example, PHY unit 110 may implement FEC operations for the various sublayers, such as used between the PMA sublayer and PCS sublayer, for example. PHY unit 110 and its corresponding FEC operations may be described in more detail with reference to FIG. 2.

Figure 2:
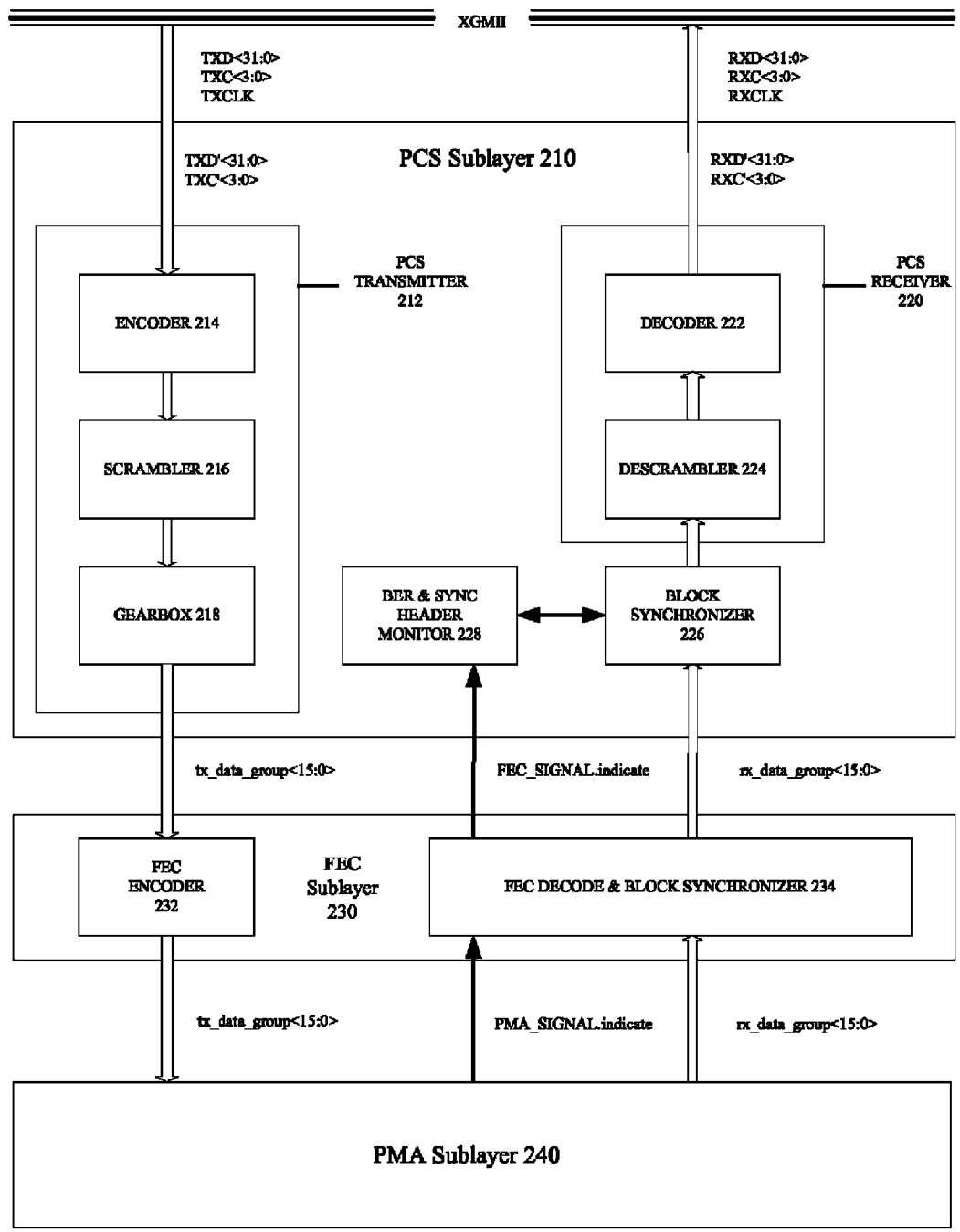
FIG. 2 illustrates one embodiment of a physical layer unit.

FIG. 2 illustrates one embodiment of a physical layer unit. FIG. 2 illustrates a block diagram for PHY unit 110. In one embodiment, for example, PHY unit 110 may be arranged to operate in accordance with any 10 GBASE-R signaling system to reduce error rate, such as a 10 GBASE-KR PHY, for example. Backplane Ethernet extends the family of 10 GBASE-R Physical Layer signaling systems to include 10 GBASE-KR. The 10GBASE-KR PHY specifies 10 Gbps operation over two differential controlled impedance pairs of traces, with one pair for transmit and one pair for receive. Although some embodiments may be described using a 10 GBASE-KR signaling system by way of example, any 10 GBASE-R signal system may be used and still fall within the scope of the embodiments. The embodiments are not limited in this context.

In various embodiments, PHY unit 110 may include a PCS sublayer 210, a FEC sublayer 230, and a PMA sublayer 240. PCS sublayer 210 and PMA sublayer 240 may implement PCS and PMA operations, respectively, for any embodiment that uses 10GBASE-R signaling systems to reduce error rate, such as a 10 GBASE-KR PHY, for example. PCS sublayer 210 may be connected to bi-directional link 115 and FEC sublayer 230. PCS sublayer 210 may include a PCS transmitter 212, a PCS receiver 220, a block synchronizer 226, and a BER and synchronization header monitor (BSHM) 228. PCS transmitter 212 may include a PCS encoder 214, a PCS scrambler 216, and a gearbox 218. PCS receiver 220 may include a PCS decoder 222 and a PCS descrambler 224.

In various embodiments, FEC sublayer 230 may implement FEC operations for any embodiment that uses 10 GBASE-R signaling systems to reduce error rate, such as a 10 GBASE-KR PHY, for example. The FEC operations may provide a coding gain to increase the link budget and bit error rate (BER) performance on a broader set of back plane channels as defined in the Backplane Ethernet Specification. The FEC operations may also provide additional margin to account for variations in manufacturing and environmental conditions.

In various embodiments, FEC sublayer 230 may be implemented in accordance with various design goals and performance constraints. For example, FEC sublayer 230 may support FEC operations for a 10 GBASE-KR PHY, full duplex mode operations for the Ethernet MAC (e.g., MAC unit 105), operations for the physical layer sublayers defined for 10 GBASE-KR (e.g., PCS, PMA and PMD), a 10.3125 Gbps effective data rate at the service interface presented by the PMA sublayer, operations over links consistent with differential controlled impedance traces on a printed circuit board with two connectors and total length up to at least one meter meeting the requirements of the Backplane Ethernet Specification, and/or support a BER objective of $10^{-12}$ or better. The embodiments are not necessarily limited to these design goals and/or performance constraints.

In various embodiments, FEC sublayer 230 may include a FEC Service Interface. The FEC Service Interface allows the 10 GBASE-KR PCS sublayer to transfer information to and from FEC sublayer 230. The FEC services are defined in an abstract manner and do not imply any particular implementation. The FEC Service Interface supports an exchange of data-units between PCS entities on either side of a 10 GBASE-KR link using request and indication primitives.

FEC sublayer 230 maps the data-units into FEC frames and passes the FEC frames to PMA sublayer 240, and vice versa.

In various embodiments, the FEC Service Interface of FEC sublayer 230 may include a FEC_UNITDATA.request (tx_data-group<15:0>) primitive. The FEC_UNITDATA.request primitive defines the transfer of data in the form of constant-width data-units from PCS sublayer 210 to FEC sublayer 230. The data supplied via FEC_UNITDATA.request is mapped by the FEC transmit process into the payload capacity of the outgoing FEC frame stream. The FEC_UNITDATA.request primitive includes a parameter of tx_data-group<15:0>. The data conveyed by FEC_UNITDATA.request is, for example, a 16-bit vector representing a single data-unit that has been prepared for transmission by the 10 GBASE-KR PCS transmit process. PCS sublayer 210 sends tx_data-group<15:0> to FEC sublayer 230 at a nominal rate of 644.53125 Megahertz (MHz), for example, which corresponds to the 10 GBASE-KR signaling speed of 10.3125 GBd. Upon receipt of this primitive, the FEC transmit process of FEC sublayer 230 maps the data conveyed by the tx_data unit<15:0> parameter into the payload of the transmitted FEC frame block stream, adds FEC overhead as required, scrambles the data, and transfers the result to PMA sublayer 240 via the PMA_UNITDATA.request primitives.

In various embodiments, the FEC Service Interface of FEC sublayer 230 may include a FEC_UNITDATA.indication (rx_data-group<15:0>) primitive. The FEC_UNITDATA.indication primitive defines the transfer of received data in the form of constant-width data-units from FEC sublayer 230 to PCS sublayer 210. The FEC_UNITDATA.indication primitive is generated by the FEC receive process in response to FEC block data received from PMA sublayer 240. The FEC_UNITDATA.indication primitive includes a parameter of rx_data-group<15:0>. The rx_data-group<15:0> parameter is, for example, a 16-bit vector that represents the data-unit transferred by FEC sublayer 230 to PCS sublayer 210. FEC sublayer 230 sends one rx_data-group<15:0> to PCS sublayer 210 whenever it has delineated approximately 16 bits of valid payload information from the incoming FEC data stream received from PMA sublayer 240. The nominal rate of generation of the FEC_UNITDATA.indication primitive is, for example, 644.53125 Mtransfers/s.

In various embodiments, the FEC Service Interface of FEC sublayer 230 may include a FEC_SIGNAL.indication (SIGNAL_OK) primitive. The FEC_SIGNAL.indication primitive is sent by FEC sublayer 230 to PCS sublayer 210 to indicate the status of the FEC receive process. The FEC_SIGNAL.indication primitive is generated by the FEC receive process in order to propagate the detection of severe error conditions, such as no valid signal being received from PMA sublayer 240, to PCS sublayer 210. The FEC_SIGNAL.indication includes a parameter of SIGNAL_OK. The SIGNAL_OK parameter can take one of two values: OK or FAIL. A value of OK denotes that the FEC receive process is successfully delineating valid payload information from the incoming data stream received from PMA sublayer 240, and this payload information is being presented to PCS sublayer 210 via the FEC_UNITDATA.indication primitive. A value of FAIL denotes that errors have been detected by the FEC receive process that prevent valid data from being presented to PCS sublayer 210. In this case the FEC_UNITDATA.indication primitive and its associated rx_data-group<15:0> parameter may be superfluous. FEC sublayer 230 generates the FEC_SIGNAL.indication primitive to PCS sublayer 210 whenever there is a change in the value of the SIGNAL_OK parameter.

In principle operation, FEC sublayer 230 performs FEC operations between PCS sublayer 210 and PMA sublayer 240. FEC sublayer 230 may include an FEC encoder 232 that receives data from PCS sublayer 210 via tx_data-group<15:0>. FEC encoder 232 transcodes 64b/66b words, performs FEC coding and framing, scrambles, and sends the FEC encoded data to PMA sublayer 240. FEC sublayer 230 may also include an FEC decoder and block synchronizer (FDBS) 234. FDBS 234 receives data from PMA sublayer 240 via rx_data-group<15:0> and a PMA-SIGNAL.indicate primitive. FDBS 234 performs descrambling, achieves FEC framing synchronization, decodes the FEC code, correcting data where necessary and possible, re-codes 64b/66b words, and sends the data to PCS sublayer 210 via rx_data-group<15:0> and a FEC-SIGNAL.indicate primitive.

In various embodiments, FEC sublayer 230 may use an FEC code. In one embodiment, for example, the FEC code may comprise a shortened cyclic code (2112, 2080) for error checking and forward error correction. The FEC block length is 2112 bits. The FEC code encodes 2080 bits of payload (or information symbols) and adds 32 bits of overhead (or parity symbols). The code is systematic, which means that the information symbols are not disturbed in anyway in the encoder and the parity symbols are added separately to the end of each block. The (2112, 2080) code is constructed by shortening the cyclic code (42987, 42955). This cyclic code may correct an error burst of t=11 bits per block. It is a systematic code well suited for correction of the burst errors typical in a backplane channel, such as resulting from error propagation in the receive equalizer.

FIG. 3 illustrates one embodiment of an FEC block. FIG. 3 illustrates an FEC block 300. FEC block 300 may provide an example of a data format suitable for use by FEC sublayer 230. Although some embodiments may describe FEC block 300 in terms of a data block, it may be appreciated that FEC block 300 may also refer to any delineated data set, such as a packet, frame, unit, cell, segment, fragment, and so forth. The embodiments are not limited in this context.

In one embodiment, for example, the total block length of FEC block 300 is 2112 bits (e.g., [32×65]+32=2112 bits). Each FEC block 300 contains 32 rows of words 0-31. Each word 0-31 comprises 65 bit, with 64 bits of payload carrying the information symbols from PCS sublayer 210, and 1 bit of overhead (e.g., T bits $T_0$ to $T_{31}$). At the end of each FEC block 300 there are 32 bits of overhead in the form of parity check bits. Transmission is from left to right within each row, and from top to bottom between rows. It may be appreciated that any number of words and parity check bits may be used for a given implementation, thereby leading to variations in a total size for FEC block 300. Furthermore, it may be appreciated that the parity check bits may be added to FEC block 300 anywhere within FEC block 300, including prepending the parity check bits to FEC block 300 before the words, appending the parity check bits to FEC block 300 after the words, interleaving the parity check bits to FEC block 300 between the various words, and so forth. The embodiments are not limited in this context.

Figure 4:
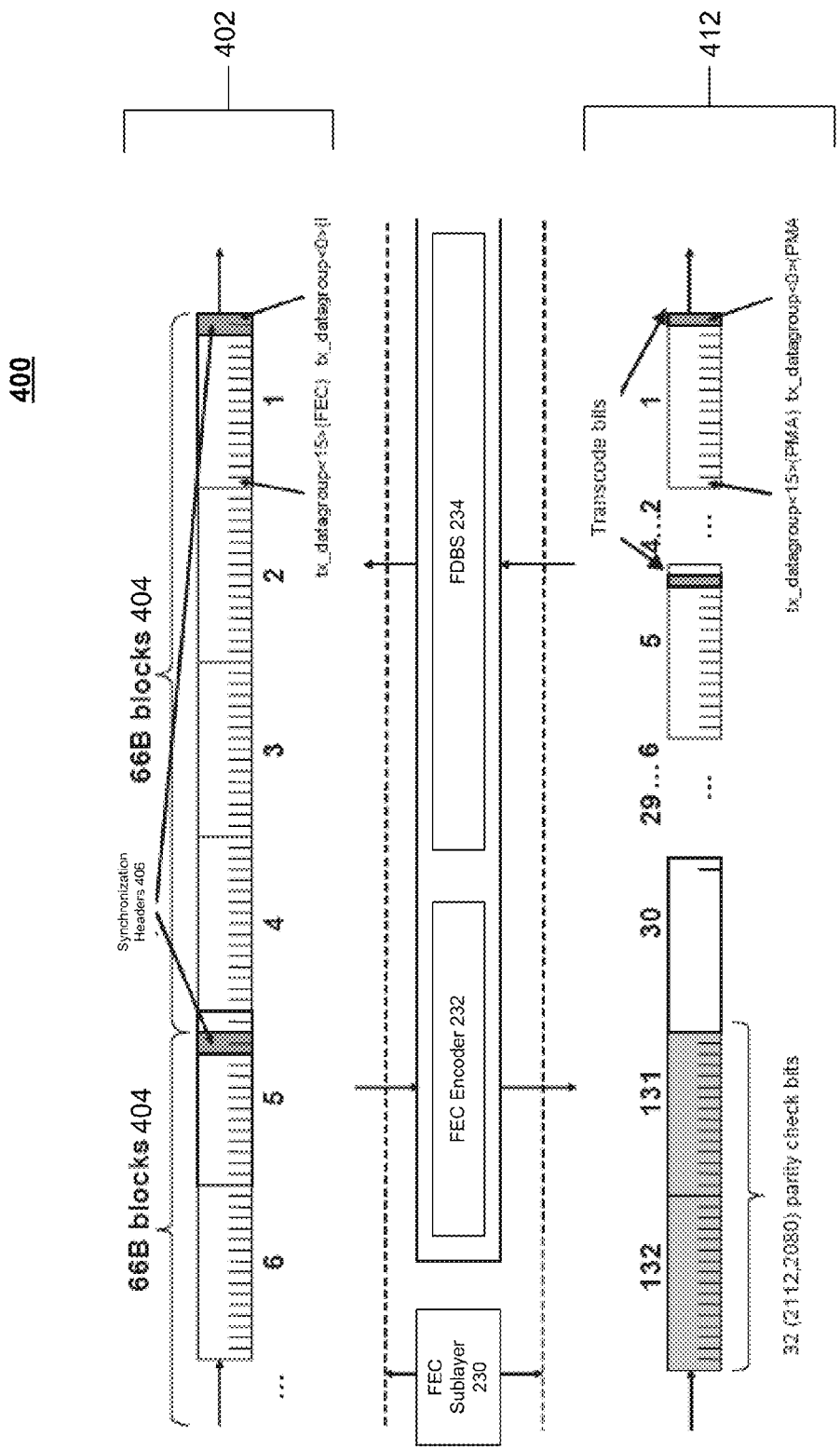
FIG. 4 illustrates one embodiment of an encoded data frame.

FIG. 4 illustrates one embodiment of an encoded data frame. FIG. 4 illustrates a set of data frames 400. Data frames 400 may provide examples of input and output frames used by FEC sublayer 230. FEC sublayer 230 may receive PCS frame 402 from PCS sublayer 210. PCS frame 402 may include multiple PCS blocks 404. For example, PCS blocks 404 may comprise 64b/66b PCS blocks. FEC encoder 232 of FEC sublayer 230 may encode PCS blocks 404, and place the encoded PCS blocks 404 into an FEC frame 412. FEC encoder 232 does not decrease the symbol rate from PCS layer 202, however, when performing FEC encoding operations. Rather, FEC encoder 232 uses 32 compressed synchronization bits from the 64b/66b encoded data of PCS blocks 404 to form an FEC block (e.g., similar to FEC block 300) having 32 parity check bits.

In general operation, PCS sublayer 210 maps 64 bits of scrambled payload data and 2 bits of unscrambled synchronization header data into 66-bit encoded blocks (e.g., PCS blocks 404). The 2-bit synchronization header data forms synchronization header 406. Synchronization header 406 allows establishment of 64b/66b PCS block boundaries by the PCS synchronization process. The two bits of synchronization header 406 may be set to "01" for data blocks and "10" for control blocks. Synchronization header 406 is the only position in 64b/66b PCS blocks 404 that always contains a transition, and this feature of the code is used to establish 64b/66b block boundaries.

In general operation, FEC encoder 232 of FEC sublayer 230 receives PCS frame 402 from PCS sublayer 210. FEC encoder 232 replaces the two synchronization bits of synchronization header 406 with a single bit, referred to herein as a transcode bit. Stated differently, FEC encoder 232 compresses the two synchronization bits of synchronization header 406 into a single transcode bit. The transcode bit carries the state of both 10 GBASE-KR synchronization bits for the associated payload. This may be achieved by eliminating the first synchronization bit in PCS block 404, and preserving only the second bit. The value of the second bit uniquely defines the value of the removed first bit since it is always an inversion of the first bit. The transcode bits are further scrambled as described later to ensure DC balance.

FEC encoder 232 takes 32 PCS blocks 404 and encodes it into a single FEC block of 2112 bits. FEC encoder 232 transcodes the 32 sequential 64b/66b PCS blocks 404 into 32 65-bit blocks, and computes 32 bits of FEC parity for each of 32 PCS blocks 404 to generate a total of 32 parity check bits. The 32 transcoded words and the 32 FEC parity bits may comprise an FEC block of 2112 bits (e.g., FEC block 300). After transcoding each of 64b/66b to 65-bit blocks, FEC encoder 232 computes the FEC Parity on the entire 32 65-bit blocks. Taking 1 synchronization bit from each 66b block creates 32-bit space at the end of 32 65-bit blocks. This 32-bit space may be used to carry the 32-bit parity check. Parity is typically computed on the entire FEC block, which in one embodiment is 2080 bits (e.g., 32×65 bits=2080 bits).

The error detection property of the FEC cyclic code is used to establish block synchronization at FEC block boundaries at the receiver. If decoding passes successfully, FDBS 234 produces 32 65-bit words, with the first decoded bit of each word being the transcode bit. FDBS 234 constructs the first synchronization bit of synchronization header 406 by inverting the transcode bit. FDBS 234 sets a value for the second synchronization bit of synchronization header 406 to the value of the transcode bit. FDBS 234 may send the reconstructed synchronization header 406 to PCS sublayer 210 for use by BSHM 228 and block synchronizer 226, for example.

Figure 5:
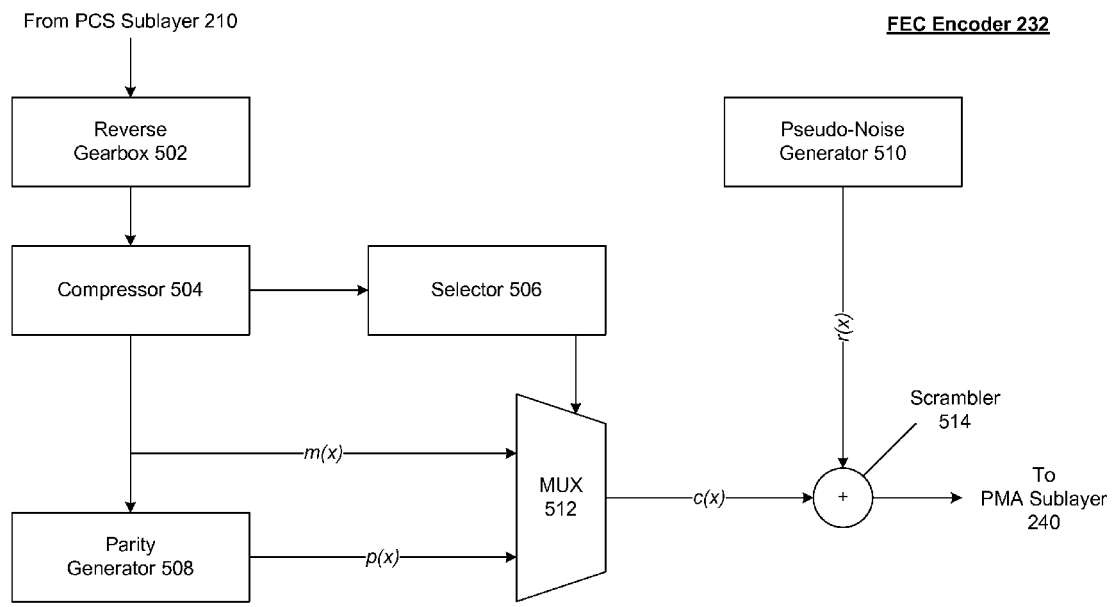
FIG. 5 illustrates one embodiment of a forward error correcting encoder.

FIG. 5 illustrates one embodiment of a forward error correcting encoder. FIG. 5 illustrates a block diagram for FEC encoder 232. As shown in FIG. 5, FEC encoder 232 may comprise a reverse gearbox 502, a compressor 504, a selector 506, a parity generator 508, a pseudo-noise generator 510, a multiplexer 512, and a scrambler 514. Although FIG. 5 illustrates FEC encoder 232 with a limited number of elements by way of example, it may be appreciated that more or less elements may be used for FEC encoder 232 as desired for a given implementation. The embodiments are not limited in this context.

In operation, FEC encoder 232 sends transmit data-units to a PMA service interface for PMA sublayer 240 via the PMA_UNITDATA.request primitive. When the transmit channel is in test-pattern mode, a test pattern is packed into the transmit data-units that are sent to the PMA service interface via the PMA_UNITDATA.request primitive.

In various embodiments, FEC encoder 232 may include a reverse gearbox 502. Reverse gearbox 502 may connect, for example, to PCS gearbox 218 of PCS sublayer 210 using the 16-bit tx_data-group<15:0>. Reverse gearbox 502 adapts between the 66-bit width of the 64b/66b blocks and the 16-bit width of the PCS service interface for PCS sublayer 210. Reverse gearbox 502 receives a 16-bit stream from the PCS service interface (e.g., PCS gearbox 218), and converts it back to 66-bit encoded blocks for processing by FEC encoder 232. Reverse gearbox 502 operates similar to the block synchronization operations defined in the Backplane Ethernet Specification (e.g., 802.3-2005 specification, clause 49). When the transmit channel is operating in normal mode, reverse gearbox 502 receives data via the 16-bit FEC_UNITDATA.request primitive. Reverse gearbox 502 will form a bit stream from the primitives by concatenating requests with the bits of each primitive in order to form tx_data-group<0> to tx_data-group<15>. Reverse gearbox 502 obtains a lock on the 66-bit blocks in the bit stream using the synchronization headers, and outputs 66-bit blocks. Lock operations may be further defined in the Backplane Ethernet Specification (e.g., 802.3-2005 specification, clause 49). Reverse gearbox 502 may be needed only when the optional PMA compatibility interface named XSBI is implemented between PCS sublayer 210 and FEC sublayer 230, since the XSBI interface passes data via a 16-bit wide data path. When the XSBI interface is not implemented, the internal width of the data path between PCS sublayer 210 and FEC sublayer 240 may vary in accordance with a desired implementation. Accordingly, reverse gearbox 502 may be obviated for some implementations depending on the width of the data path In various embodiments, FEC encoder 232 may include compressor 504. Compressor 504 may be connected to reverse gearbox 502. Compressor 504 receives the 66-bit block outputs from reverse gearbox 502. Compressor 504 retrieves the two synchronization bits from each block, compresses the two synchronization bits to one transcode bit (e.g., $T_0$ to $T_{31}$), and outputs a 65-bit block comprising 64-bits of PCS payload and 1 transcode bit. Compressor 504 outputs the 65-bit blocks to parity generator 508 and multiplexer 512. Compressor 504 also outputs a control signal to selector 506.

In various embodiments, FEC encoder 232 may include parity generator 508. Parity generator 508 receives the 65-bit blocks from compressor 504, and produces parity check bits for the blocks. For example, parity generator 508 uses the polynomial g(x) to generate the parity check bits p(x), as described in more detail below. Parity generator 508 outputs the parity check bits to multiplexer 514.

In various embodiments, FEC encoder 232 may include selector 506 and multiplexer 512. Multiplexer 512 may receive the 65-bit blocks and parity check bits from compressor 504 and parity generator 508, respectively. Multiplexer 512 may also receive a selection signal from selector 506. Multiplexer 512 may append the 32 parity check bits for the 32 65-bit blocks (e.g., 32×65 bits=2080 bits) to the end of an FEC frame (e.g., FEC frame 300) thereby making an FEC frame having 2112 bits (e.g., 2080 bits+32 parity check bits=2112 bits). Multiplexer 512 may output the FEC frame to scrambler 514.

In various embodiments, FEC encoder 232 may include pseudo-noise generator 510. Pseudo-noise generator 510 may generate a pseudo-noise sequence, and output the pseudo-noise sequence to scrambler 514.

In various embodiments, scrambler 514 receives the FEC frame with the 32 parity check bits and the pseudo-noise sequence from multiplexer 512 and pseudo-noise generator 510, respectively. Scrambler 514 may scramble the FEC frame using the pseudo-noise sequence. Scrambler 514 may output the scrambled FEC frame to a PMA service interface for PMA sublayer 240 via tx_data-group<15:0>.

In operation, FEC encoder 232 encodes the 32×65 bit payload blocks using a (2112, 2080) code. The code is a shortened cyclic code that can be encoded by generator polynomial g(x). The cyclic code is well suited for correcting burst errors and therefore may also be referred to as a binary burst error correction code. The resulting payload block including the T bits is scrambled using the PN-2112 pseudo-noise sequence of pseudo-noise generator 510. For example, compressor 504 provides m(x) which is stream of 65b message bits to both parity generator 508 and multiplexer 512. Parity generator uses the g(x) polynomial to generate parity check bits p(x) for 32 65-bit blocks. Compressor 504 also sends a select signal for the first 32 65-bit blocks so that multiplexer 512 outputs m(x). Then it selects p(x) so that multiplexer 512 outputs p(x) at the end of every FEC block.

The generator polynomial g(x) for the (2112, 2080) parity check bits is defined in accordance with Equation (1) as follows:

$$g(x)=x^{32}+x^{23}+x^{21}+x^{11}+x^2+1 \quad \text{Equation (1)}$$

If the polynomial representation of information bits is denoted as m(x), the codeword denoted as c(x) can be calculated in systematic form as defined in accordance with Equations (2) and (3) as follows:

$$p(x)=x^{32}m(x) \bmod g(x) \quad \text{Equation (2)}$$

$$c(x)=p(x)+x^{32}m(x) \quad \text{Equation (3)}$$

where multiplication on $x^{32}$ is performed using shifts. Systematic form of the codeword means that first 2080 bits of the codeword c(x) are information bits that can be extracted directly.

Figure 6:
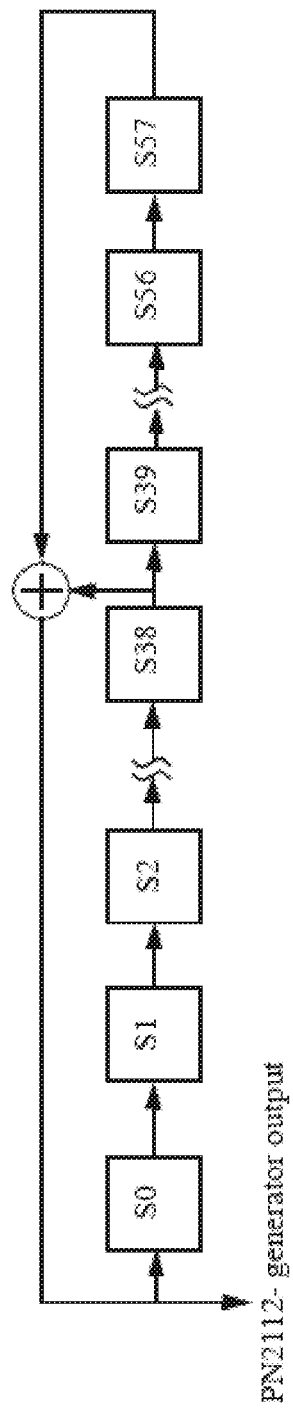
FIG. 6 illustrates one embodiment of a pseudo-noise generator.

FIG. 6 illustrates one embodiment of a pseudo-noise generator. FIG. 6 illustrates a block diagram for pseudo-noise generator 510. In one embodiment, for example, pseudo-noise generator 510 may comprise a pseudo-noise sequence of length 2112 (PN-2112) generated by the polynomial r(x), which is equal to the scrambler polynomial defined in the Backplane Ethernet Specification having an initial state $S_{57}=1$, $S_{i-1}=S_i$ XOR 1 or rather the binary sequence of "101010 . . ." Before each FEC block processing (encoding or decoding), pseudo-noise generator 510 is initialized with the state of "101010 . . ." Pseudo-noise generator 510 shall produce the same result as the implementation shown in FIG. 6. This implements the PN-2112 generator polynomial as defined in accordance with Equation (4) as follows:

$$r(x)=1+x^{39}+x^{58} \quad \text{Equation (4)}$$

Scrambling with the PN-2112 sequence at the FEC codeword boundary may be necessary for establishing FEC block synchronization to ensure that any shifted input bit sequence is not equal to another FEC codeword, as well as to ensure DC balance.

Figure 7:
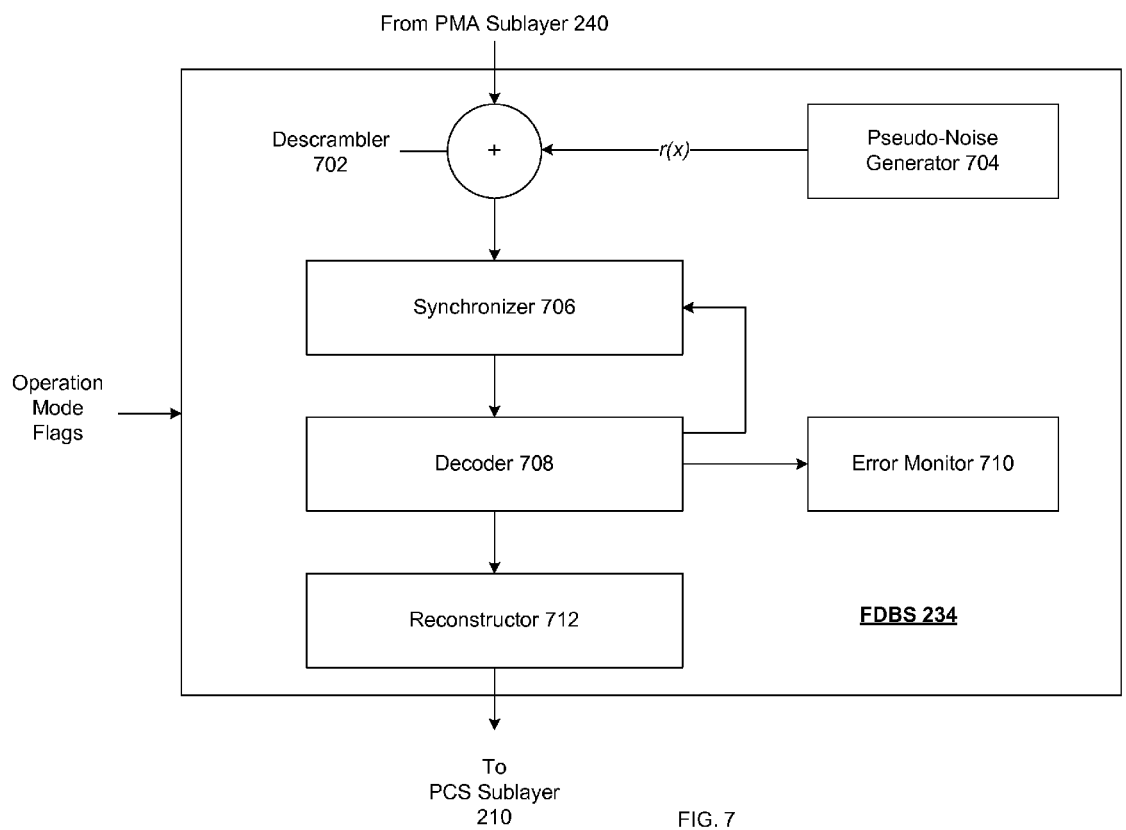
FIG. 7 illustrates one embodiment of a forward error correcting decoder.

FIG. 7 illustrates one embodiment of a forward error correcting decoder.

FIG. 7 illustrates an FEC decoder, such as FDBS 234. FDBS 234 performs FEC synchronization and decoding operations to reverse the FEC encoding operations performed by FEC encoder 232. As shown in FIG. 7, FDBS 234 may comprise a descrambler 702, a pseudo-noise generator 704, a synchronizer 706, a decoder 708, an error monitor 710, and a reconstructor 712. Although FIG. 7 illustrates FDBS 234 with a limited number of elements by way of example, it may be appreciated that more or less elements may be used for FDBS 234 as desired for a given implementation. The embodiments are not limited in this context.

FDBS 234 initially performs FEC synchronization operations prior to decoding and error correcting operations. When the receive channel is in normal mode of operation, FDBS 234 continuously monitors PMA_SIGNAL.indication (SIGNAL_OK). When SIGNAL_OK indicates OK, FDBS 234 accepts data-units via the PMA_UNITDATA.indication primitive. FDBS 234 attains block synchronization based on the decoding of FEC blocks and conveys received 64b/66b blocks to the PCS receive process of PCS sublayer 210. FDBS 234 sets the sync_status flag for PCS sublayer 210 to indicate whether FDBS 234 has obtained synchronization.

In various embodiments, FDBS 234 may include a descrambler 702. Descrambler 702 may receive data from PMA sublayer 240 via rx_data-group<15:0>. Descrambler 702 may also receive a PN-2112 sequence from pseudo-noise generator 704. The PN-2112 sequence may be similar to the PN-2112 sequence generated by pseudo-noise generator 510. Descrambler 702 may use the PN-2112 sequence to descramble the data received from PMA sublayer 240. Descrambler 702 may output the descrambled data to synchronizer 706.

In various embodiments, FDBS 234 may include synchronizer 706. Synchronizer 706 may perform FEC block synchronization based on repeated decoding of the received sequence. To establish FEC synchronization, FDBS 234 recovers and extracts the information bits using the parity check bit data. For example, FDBS 234 may decode some FEC blocks. FDBS 234 may take a random 2112 bit stream of data and calculate a parity using the g(x) polynomial. FDBS 234 compares the calculated parity with the 32-bit parity received at the end of a FEC block. If there is match then FDBS 234 has located the FEC block boundary. If there is no match, then FDBS 234 shifts the received bit stream by 1 bit, and performs parity comparison operations again. The shift and compare operations are repeated until the received parity matches the computed parity. A match indicates that the FEC block boundary is found or that synchronization has been achieved. Such operations are sometimes referred to as FEC block or frame delineation.

Once synchronization is achieved, then FDBS 234 may begin to recover the 65-bit data from each of the FEC frames as received via the 16-bit rx_data-group<15:0> stream received from PMA sublayer 240. After synchronization is achieved, the parity check may not match for some of the frames which may indicate an error.

In various embodiments, FDBS 234 may include decoder 708. Decoder 706 may perform FEC decoding operations. Decoder 706 may decode the data received from PMA sublayer 240 into 65-bit blocks. The 65-bit blocks may comprise, for example, the 64-bit payload information and 1 transcoding bit. Decoder 706 may output the 65-bit blocks to reconstructor 712. Decoder 706 may also output the decoded data and corresponding parity check bits to error monitor 710.

In various embodiments, FDBS 234 may include error monitor 710. Error monitor 710 may monitor the decoded data for errors using FEC detecting techniques. Error monitor 710 may use various counters to maintain counts for a number of corrected blocks and a number of uncorrected blocks. This statistical information can be used by a management entity regarding the quality of the physical medium, which in this case is a backplane channel. FDBS 234 may be arranged to indicate any decoding errors to upper layers based on a configuration option. The configuration options may be set in accordance with various operation mode flags received by FDBS 234. When FDBS 234 is arranged to indicate decoding errors, FDBS 234 indicates such errors to PCS sublayer 210 by setting both synchronization bits in each of the 64B/66B blocks to the same value (e.g., "11"), thus forcing PCS sublayer 210 to consider the block as invalid.

In various embodiments, FDBS 234 may include reconstructor 712. In case of successful decoding, reconstructor 712 restores the synchronization bits in each of the 64b/66b blocks. Reconstructor 712 may receive the 65-bit blocks from decoder 708. Reconstructor 712 may reconstruct the synchronization header for the 64-bit payload information using the 1 transcoding bit. Reconstructor 712 may append the 2-bit synchronization header to the 64-bit payload information to reconstruct the original 64b/66b block. Reconstructor 712 may send the reconstructed 64b/66b blocks to PCS sublayer 210 via rx_data-group<15:0>. Reconstructor 712 and its reconstructed output may be described in more detail with reference to FIG. 8.

Figure 8:
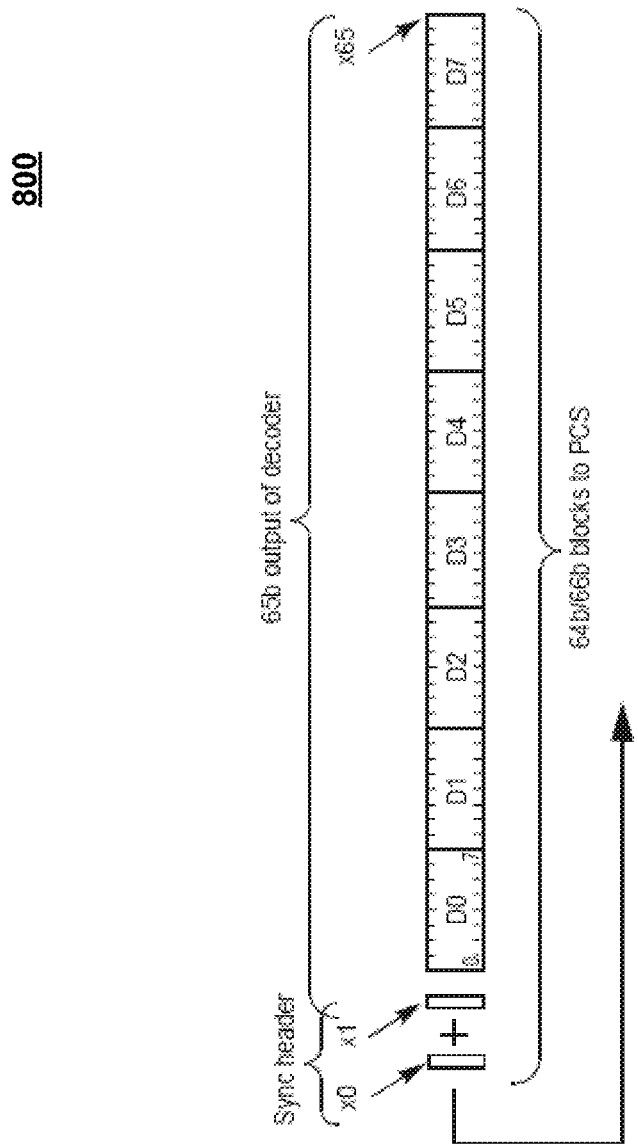
FIG. 8 illustrates one embodiment of a decoded data frames.

FIG. 8 illustrates one embodiment of a decoded data frame. FIG. 8 illustrates a decoded data frame 800. Decoded data frame 800 may comprise a reconstructed 64b/66b block suitable for use by PCS sublayer 210. As shown in FIG. 8, decoded data frame 800 comprises 66 bits, with bits x0 and x1 comprising the 2 synchronization bits of synchronization header 802. Decoded data frame 800 may also illustrate the 65-bit output of decoder 708 as bits x1 to x65. Reconstructor 712 may reconstruct the first synchronization bit x0 from the transcoded bit x1, add the first synchronization bit x0 to synchronization header 802, thereby forming a reconstructed 64b/66b block comprising bits x0 to x65. FDBS 234 may send the reconstructed 64b/66b block to PCS sublayer 210.

Operations for the above embodiments may be further described with reference to the following figures and accompanying examples. Some of the figures may include a logic flow. Although such figures presented herein may include a particular logic flow, it can be appreciated that the logic flow merely provides an example of how the general functionality as described herein can be implemented. Further, the given logic flow does not necessarily have to be executed in the order presented unless otherwise indicated. In addition, the given logic flow may be implemented by a hardware element, a software element executed by a processor, or any combination thereof. The embodiments are not limited in this context.

Figure 9:
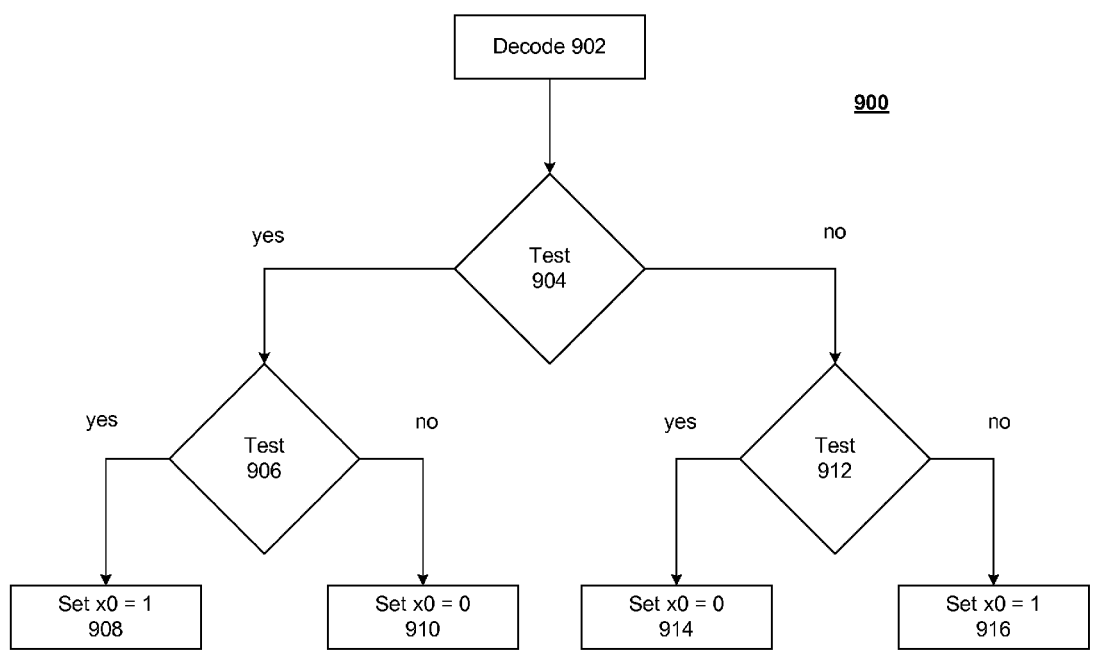
FIG. 9 illustrates one embodiment of a first logic flow.

FIG. 9 illustrates one embodiment of a first logic flow. FIG. 9 illustrates a logic flow 900. Logic flow 900 may be representative of the operations executed by one or more embodiments described herein, such as reconstructor 712 of FDSB 234. More particularly, logic flow 900 may illustrate reconstruction operations for FDSB 234. As shown in logic flow 900, each of the 32 65-bit data words is extracted from the recovered FEC block and the 2-bit synchronization header is reconstructed for the 64b/66b codes from the transcode bit at block 902. FDSB 234 provides a configuration option that indicates decoding errors in the reconstructed synchronization bits. For example, the configuration option may instruct FDSB 234 to reconstruct synchronization bits to be one of the possible combinations "01" or "10" if decoding successful. Alternatively, the configuration option may instruct FDSB 234 to reconstruct synchronization bits to additional codes "00" and "11" if a decoding error has occurred. This information corresponds to one complete (2112, 2080) FEC frame that is equal to 32 64b/66b code blocks.

In accordance with the configuration option, a determination may be made as to whether decoding was successful (e.g., without errors) at block 904. If decoding was successful, then a determination may be made as to a value for bit x1 of the 65-bit data block from decoder 708. If the value for bit x1 is equal to 0 (e.g., x1=0), then x0 is set to 1 (e.g., x0=1), otherwise x0 is set to 0 (e.g., x0=0). In this case, the synchronization header may comprise "01" or "10" to indicate valid decoding. If decoding was unsuccessful (e.g., with errors) at block 904, then a determination may be made as to a value for bit x1 of the 65-bit data block from decoder 708. If the value for bit x1 is equal to 0 (e.g., x1=0), then x0 is set to 0 (e.g., x0=0), otherwise x0 is set to 1 (e.g., x0=1). In this case, the synchronization header may comprise "00" or "11" to indicate invalid decoding.

Figure 10:
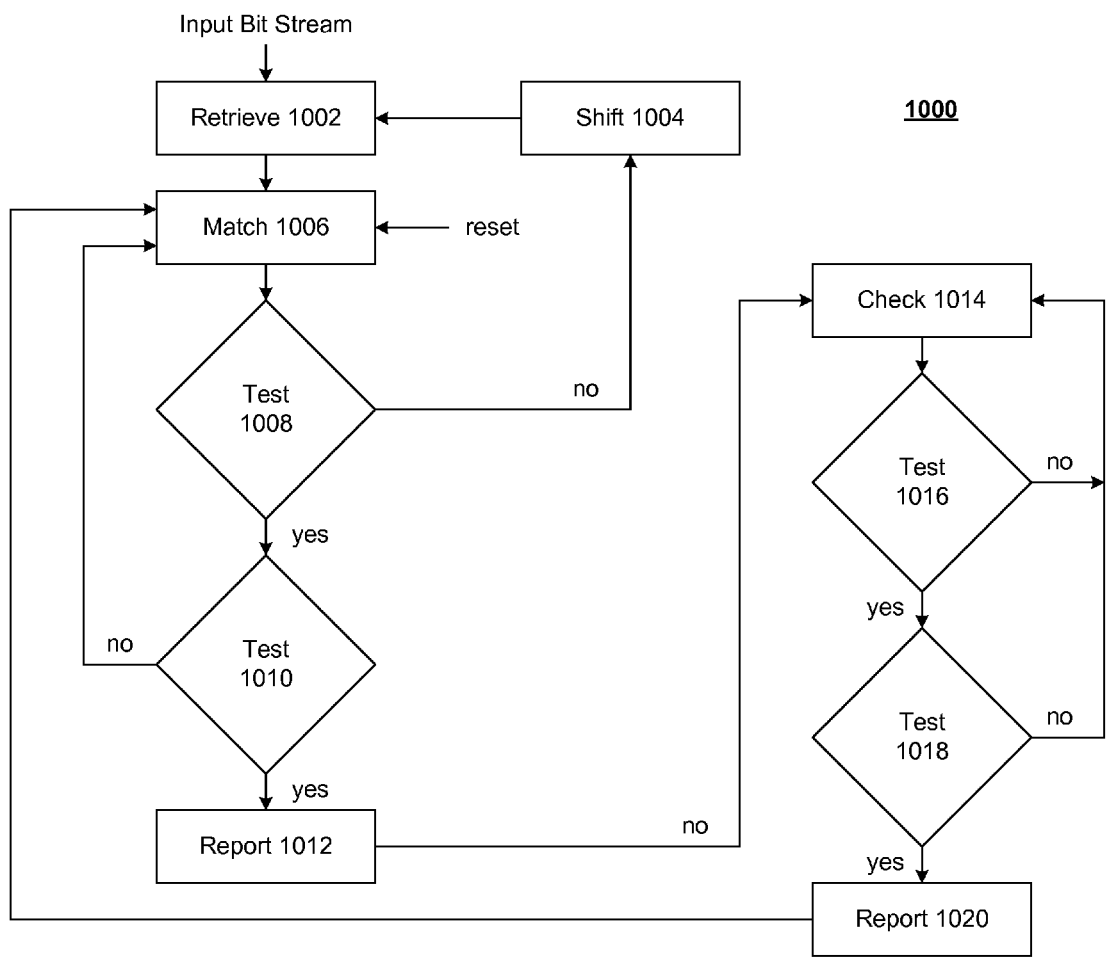
FIG. 10 illustrates one embodiment of a second logic flow.

FIG. 10 illustrates one embodiment of a second logic flow. FIG. 10 illustrates a logic flow 1000. Logic flow 1000 may be representative of the operations executed by one or more embodiments described herein, such as synchronizer 706 of FDSB 234. More particularly, logic flow 100 may illustrates FEC synchronization operations for the 2112 bit FEC frame using FEC decoding. Receive Frame synchronization may be achieved using various n/m serial locking techniques as illustrated by logic flow 1000. As shown in logic flow 1000, a candidate block start position from the FEC block synchronization buffer may be tested at block 1002. Parity matching for the potential 2112 bit block may be performed at block 1006 and evaluated at block 1008. If it fails, the candidate start bit may be shifted by one bit position at block 1004, and the operations for blocks 1002, 1006 and 1008 may be repeated until decoding is successful at block 1008.

If decoding is successful at block 1008, the potential block start position may be validated by determining whether decoding operations were successful (e.g., good parity) for n consecutive blocks at block 1010. If any of them fail, the start position may be shifted one bit position and the operations for blocks 1006, 1008 and 1010 may be repeated until good parity has been achieved for n consecutive blocks at block 1010.

If decoding operations were successful for n consecutive blocks at block 1010, synchronizer 706 may report FEC block synchronization has been established at block 1012. Meanwhile, FEC block synchronization may be validated by continuously performing parity matching at block 1014 to determine whether decoding operations were unsuccessful (e.g., bad parity) at block 1016. If m consecutive blocks are received with bad parity at block 1018, report a drop in FEC block synchronization at block 1020, and restart FEC synchronization operations again at block 1002. Otherwise, continue monitoring operations at blocks 1014, 1016 and 1018 until m consecutive blocks are received with bad parity at block 1018.

The FEC synchronization operations illustrated by logic flow 1000 may be repeated at most 2111 times for all bits positions in the 2112 code word. For example, if a potential candidate start position is tested at block 1008 and it does not match, then the buffer is shifted by 1 bit position by block 1004 and then matched again at block 1006. This cycle of shifting and matching will be repeated at most 2111 times before finding a match or achieving synchronization. Assume the potential block start position is missed by 1 bit, the FEC synchronization operations may continue the shift and match operations for 2111 times (e.g., 2112−1=2111 bits) before a match is found. In one embodiment, for example, the default values for m and n may be set to m=8 and n=4. The embodiments are not limited in this context.

In various embodiments, FEC sublayer 230 shall have the capability to enable or disable FEC operations. For example, a management data input/output (MDIO) interface or equivalent management interface shall be provided to access the variable Enable_FEC as defined by the Backplane Ethernet Specification. When the Enable_FEC variable bit is set to a one, this enables FEC sublayer 230 operations for the 10 GBASE-KR PHY. When the Enable_FEC variable bit is set to zero, FEC sublayer 230 operations are disabled in the 10 GBASE-KR PHY. The Enable_FEC variable shall be set to zero upon execution of PHY reset. When FEC operations are disabled, PHY unit 110 should include a bypass technique to bypass FEC encode/decode operations so as to not cause additional latency associated with such encoding or decoding functions.

In various embodiments, auto-negotiation operations may also be used to enable FEC. Auto-negotiation may be used to negotiate the FEC capability by the link partners at both the ends, and then enable FEC only if both ends support FEC sublayer 230. The FEC capability can be negotiated between peer devices using the auto-negotiation function as defined in clause 73 of the Backplane Ethernet Specification. For example, FEC (F0) is encoded in bit D47 of the base link code word. The default value is logic zero. When the FEC capability bit F0 is set to logic one, it indicates that the FEC function is enabled for 10 GBASE-KR PHY. Since the local device and the link partner may have enabled the FEC bits differently, the priority resolution function is used to select the FEC modes in the device. The FEC is enabled on the link only if both ends advertise the same status on the F0 bits. The embodiments are not limited in this context.

In various embodiments, management and error monitoring operations for FEC sublayer 230 may be performed using various counters. The counters may be accessed via an MDIO interface or equivalent management interface. The counters are reset to zero upon a read operation or upon reset of FEC sublayer 230. When a counter reaches all ones, it stops counting. The purpose of the various counters is to assist in monitoring the quality of the communication link.

In one embodiment, for example, FEC sublayer 230 may use a FEC_corrected_blocks_counter. The FEC_corrected_blocks_counter may count once for each corrected FEC blocks processed. This is a 32-bit counter. This variable is provided by a management interface that may be mapped to the appropriate register as defined by the Backplane Ethernet Specification.

In one embodiment, for example, FEC sublayer 230 may use a FEC_uncorrected_blocks_counter. The FEC_uncorrected_blocks_counter may count once for each uncorrected FEC blocks processed. This is a 32-bit counter. This variable is provided by a management interface that may be mapped to the appropriate register as defined by the Backplane Ethernet Specification.

Figure 11:
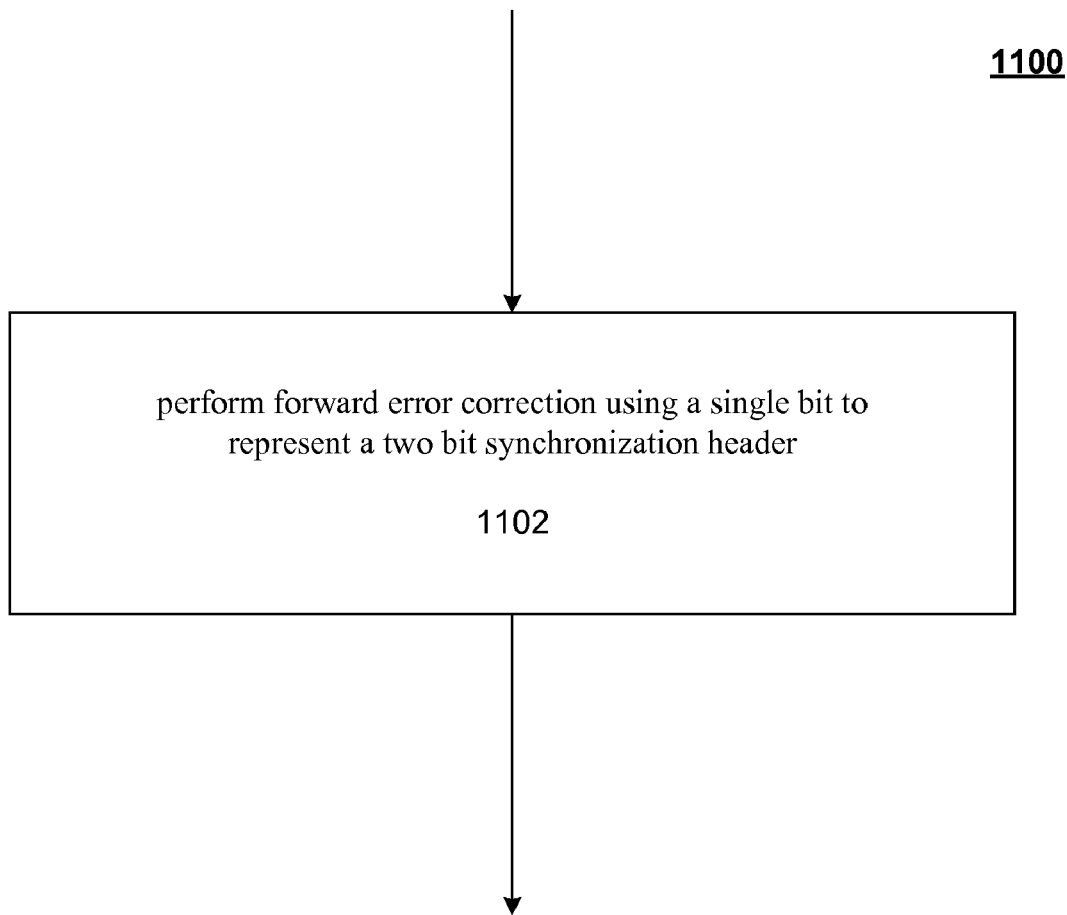
FIG. 11 illustrates one embodiment of a third logic flow.

FIG. 11 illustrates one embodiment of a third logic flow. FIG. 11 illustrates a logic flow 1100. Logic flow 1100 may be representative of the operations performed by FEC sublayer 230. In one embodiment, for example, FEC may be performed using a single bit such as a transcode bit to represent a two bit synchronization header at block 1102. The embodiments are not limited in this context.

In one embodiment, for example, a PCS block of information may be encoded by replacing the two bit synchronization header with the single transcode bit. Encoding operations may include receiving physical coding sublayer blocks of information, replacing two synchronization bits from each block with a single transcode bit, generating parity check bits for the blocks, and generating a forward error correction frame using the blocks and the parity check bits. The embodiments are not limited in this context.

In one embodiment, for example, PMA block of information may be decoded by reconstructing the two bit synchronization header using the single transcode bit. Decoding operations may include receiving physical coding sublayer blocks of information, decoding each physical coding sublayer block, retrieving a parity check bit for each physical coding sublayer, and performing forward error correction using the parity check bits. The embodiments are not limited in this context.

Figure 12:
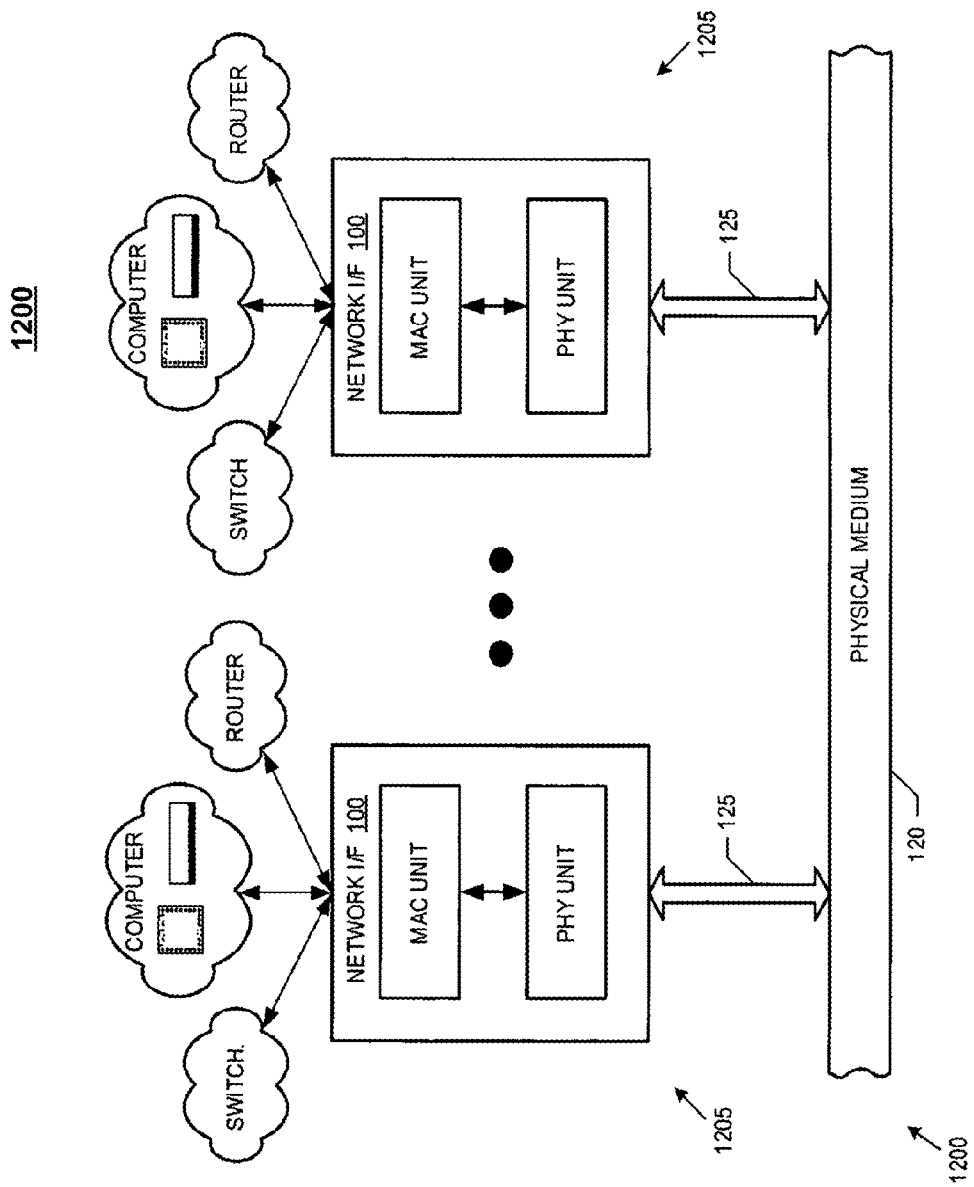
FIG. 12 illustrates one embodiment of a communications system.

FIG. 12 illustrates one embodiment of a communications system. FIG. 12 illustrates a communications system 1200 suitable for use with network interface 100. In one embodiment, for example, communications system 1200 may comprise a communication system having multiple nodes. A node may comprise any physical or logical entity for communicating information in communications system 1200 and may be implemented as hardware, software, or any combination thereof, as desired for a given set of design parameters or performance constraints. Although FIG. 12 is shown with a limited number of nodes in a certain topology, it may be appreciated that system 1200 may include more or less nodes in any type of topology as desired for a given implementation. The embodiments are not limited in this context.

In various embodiments, a node may comprise a processing system, a computer system, a computer sub-system, a computer, a workstation, a terminal, a server, a bladed server, a modular server, a line card, a switching subsystem, a bridge, a router or a combination thereof, a personal computer (PC), a laptop computer, an ultra-laptop computer, a portable computer, a handheld computer, a personal digital assistant (PDA), a microprocessor, an integrated circuit, a programmable logic device (PLD), a digital signal processor (DSP), a processor, a circuit, a logic gate, a register, a microprocessor, an integrated circuit, a semiconductor device, a chip, a transistor, and so forth. The embodiments are not limited in this context.

In various embodiments, a node may comprise, or be implemented as, software, a software module, an application, a program, a subroutine, an instruction set, computing code, words, values, symbols or combination thereof. A node may be implemented according to a predefined computer language, manner or syntax, for instructing a processor to perform a certain function. Examples of a computer language may include C, C++, Java, BASIC, Perl, Matlab, Pascal, Visual BASIC, assembly language, machine code, microcode for a processor, and so forth. The embodiments are not limited in this context.

Communications system 1200 may be implemented as a wired communication system, a wireless communication system, or a combination of both. Although communications system 1200 may be illustrated using a particular communications media by way of example, it may be appreciated that the principles and techniques discussed herein may be implemented using any type of communication media and accompanying technology. The embodiments are not limited in this context.

When implemented as a wired system, for example, communications system 1200 may include one or more nodes arranged to communicate information over one or more wired communications media. Examples of wired communications media may include a wire, cable, printed circuit board (PCB), backplane, midplane, switch fabric, semiconductor material, twisted-pair wire, co-axial cable, fiber optics, and so forth.

The communications media may be connected to a node using an input/output (I/O) adapter. The I/O adapter may be arranged to operate with any suitable technique for controlling information signals between nodes using a desired set of communications protocols, services or operating procedures. The I/O adapter may also include the appropriate physical connectors to connect the I/O adapter with a corresponding communications medium. Examples of an I/O adapter may include a network interface, a NIC, disc controller, video controller, audio controller, and so forth. The embodiments are not limited in this context.

When implemented as a wireless system, for example, communications system 1200 may include one or more wireless nodes arranged to communicate information over one or more types of wireless communication media, sometimes referred to herein as wireless shared media. An example of a wireless communication media may include portions of a wireless spectrum, such as the radio-frequency (RF) spectrum. The wireless nodes may include components and interfaces suitable for communicating information signals over the designated wireless spectrum, such as one or more antennas, wireless transceivers, amplifiers, filters, control logic, and so forth. As used herein, the term "transceiver" may be used in a very general sense to include a transmitter, a receiver, or a combination of both. Examples for the antenna may include an internal antenna, an omni-directional antenna, a monopole antenna, a dipole antenna, an end fed antenna, a circularly polarized antenna, a micro-strip antenna, a diversity antenna, a dual antenna, an antenna array, a helical antenna, and so forth. The embodiments are not limited in this context.

As shown in FIG. 12, communications system 1200 may include multiple network devices 1205 coupled to physical medium 120 using network interface 100. In various embodiments, network interface 100 and/or network devices 1205 may include a processor. The processor may be implemented using any processor or logic device, such as a complex instruction set computer (CISC) microprocessor, a reduced instruction set computing (RISC) microprocessor, a very long instruction word (VLIW) microprocessor, a processor implementing a combination of instruction sets, or other processor device. In one embodiment, for example, the processor may be implemented as a general purpose processor, such as a processor made by Intel® Corporation, Santa Clara, Calif. The processor may also be implemented as a dedicated processor, such as a controller, microcontroller, embedded processor, a digital signal processor (DSP), a network processor, a media processor, an input/output (I/O) processor, a media access control (MAC) processor, a radio baseband processor, a field programmable gate array (FPGA), a programmable logic device (PLD), and so forth. The embodiments, however, are not limited in this context.

In one embodiment, network interface 100 and/or network devices 1205 may include a memory to connect to the processor. The memory may be implemented using any machine-readable or computer-readable media capable of storing data, including both volatile and non-volatile memory. For example, the memory may include read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, magnetic or optical cards, or any other type of media suitable for storing information. It is worthy to note that some portion or all of the memory may be included on the same integrated circuit as the processor, or alternatively some portion or all of the memory may be disposed on an integrated circuit or other medium, for example a hard disk drive, that is external to the integrated circuit of the processor. The embodiments are not limited in this context.

As previously described, FEC sublayer 230 may use a binary burst error correction code of rate (2112, 2080) encode transmissions over high speed serial networks. The Backplane Ethernet Specification specifies the use of a decision feedback equalizer (DFE) as a tool for intersymbol interference (ISI) cancellation. The DFE output bitstream, however, typical has grouping errors also referred as error bursts due to error propagation in the DFE. Consequently, FEC sublayer 230 uses the (2112, 2080) code. The (2112, 2080) code is a shortened cyclic binary burst error correction code with 32 redundant bits (also called parity check bits). This is a highly efficient code that provides the capability for a receiver at the receiving end of the network to correct error bursts up to 11 or 16 bits in length with relatively low latency. The code is generated using the generator polynomial g(x) as previously specified in Equation (1).

FIGS. 13-19 illustrate various graphs. Each graph illustrates values representing bit error rates (BER) on a y-axis, and values representing signal-to-noise-ratio (SNR) in decibels (dB) on an x-axis. Each graph may be used to compare a BER of the (2112, 2080) code and uncoded transmission in various backplane channels. For example, each graph shows a coding gain using the binary burst error correction code of rate (2112, 2080), where for any particular BER the difference between the uncoded and coded plot lines provide the coding gain for that particular BER.

Figure 13:
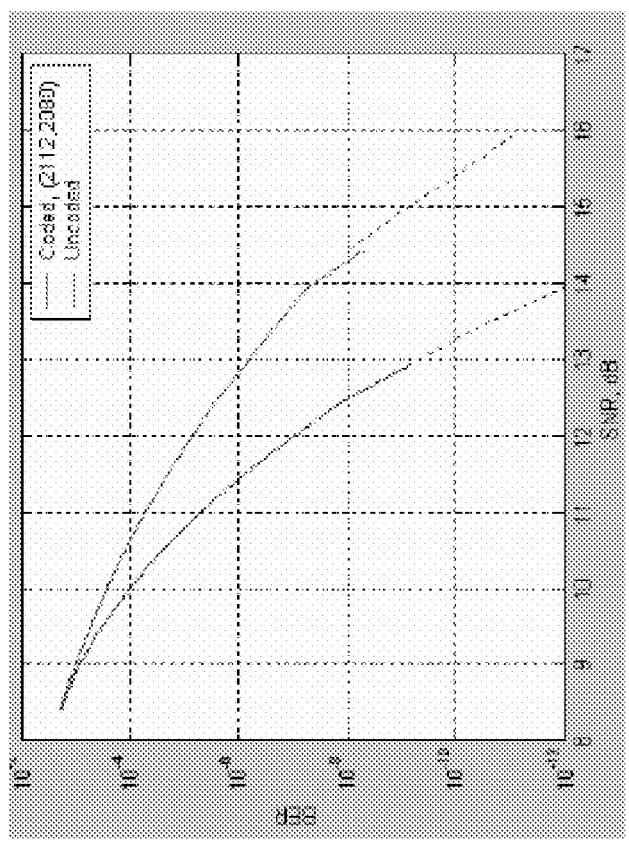
FIG. 13 illustrates one embodiment of a first graph.
Figure 14:
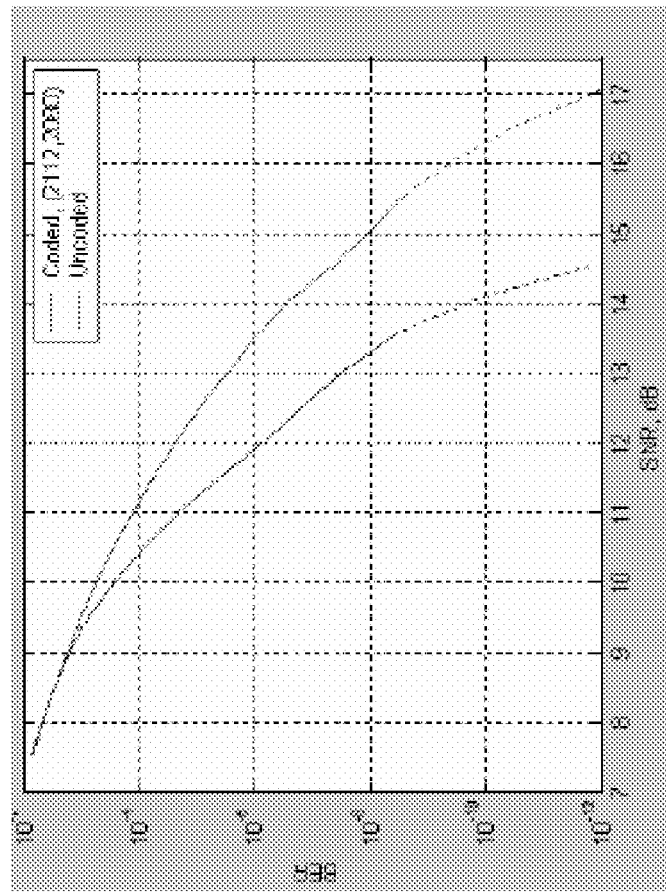
FIG. 14 illustrates one embodiment of a second graph.
Figure 15:
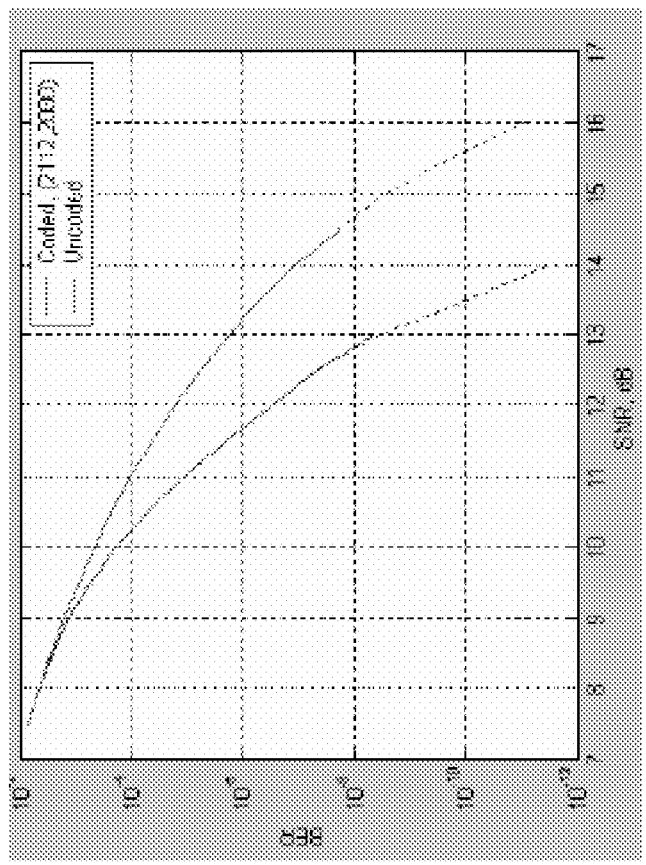
FIG. 15 illustrates one embodiment of a third graph.

FIGS. 13-15 may illustrate various simulations related to backplanes made by Intel Corporation. FIGS. 13-15 may illustrate graphs 1300, 1400 and 1500, respectively. Graphs 1300-1500 may be used to compare a BER of the (2112, 2080) code and uncoded transmission for various backplane channels T12, M20 and B1. SNR is equal to the SNR at a slicer with simulations to BER of $10^{-8}/10^{-9}$ and extrapolated to $10^{-12}$. Graphs 1300-1500 indicate that simulations show an approximate 2 dB coding gain at a BER of $10^{-9}$, for example.

Figure 16:
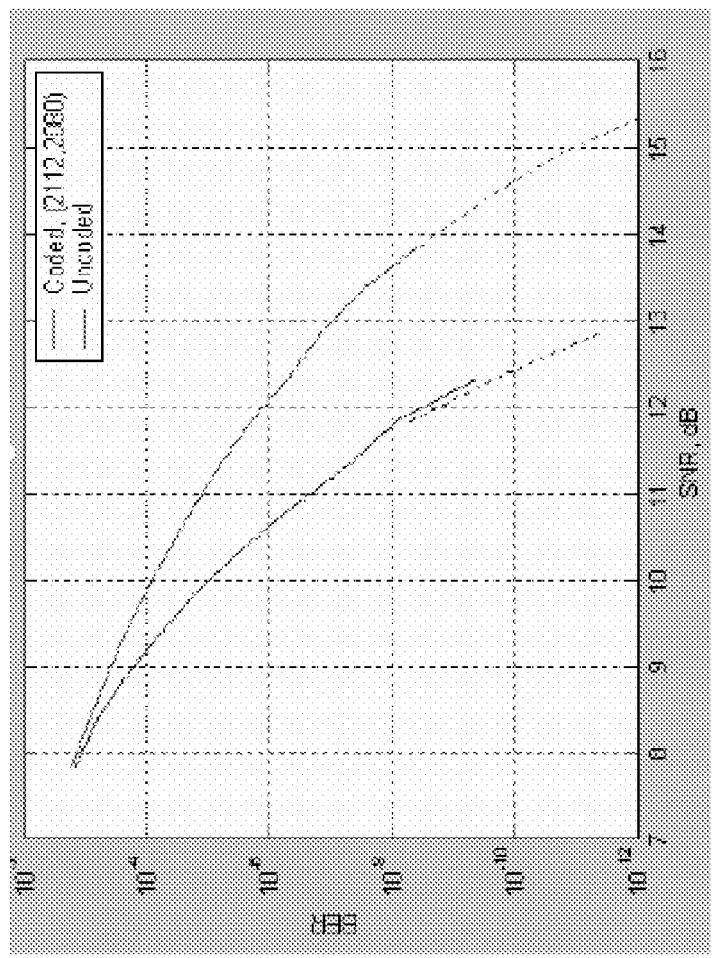
FIG. 16 illustrates one embodiment of a fourth graph.
Figure 17:
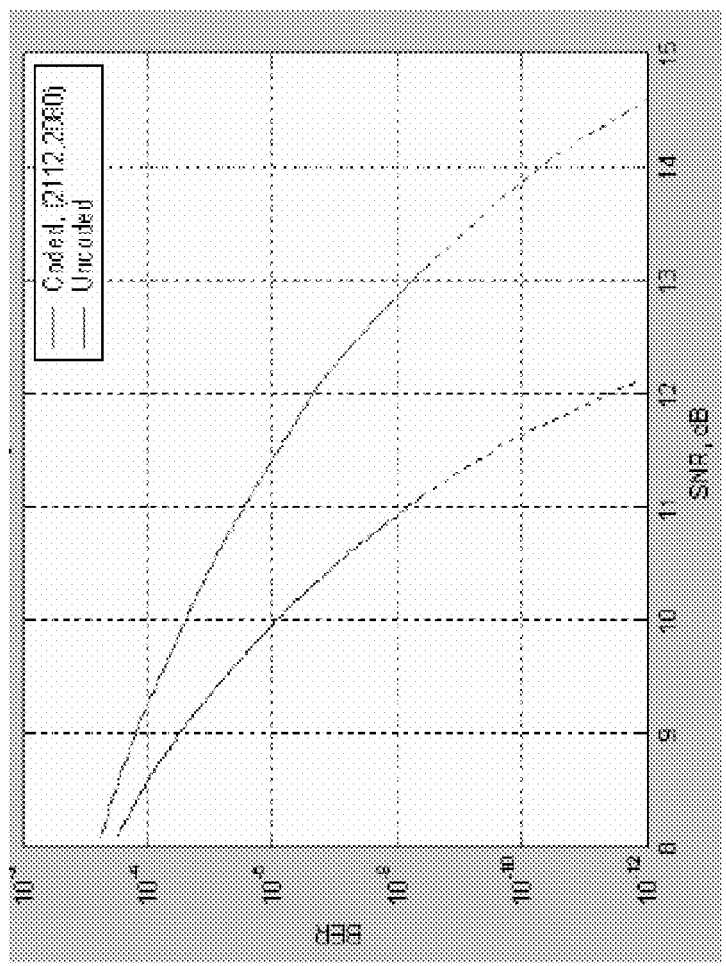
FIG. 17 illustrates one embodiment of a fifth graph.

FIGS. 16-17 may illustrate various simulations related to backplanes made by Tyco International, Ltd. FIGS. 16-17 may illustrate graphs 1600 and 1700, respectively. Graphs 1600, 1700 may be used to compare a BER of the (2112, 2080) code and uncoded transmission for various backplane test channels of Case 3 and Case 4. SNR is equal to the SNR at a slicer with simulations to BER of $10^{-8}/10^{-9}$ and extrapolated to $10^{-12}$. Graphs 1600, 1700 indicate that simulations also show an approximate 2 dB coding gain at a BER of $10^{-9}$, for example.

Figure 18:
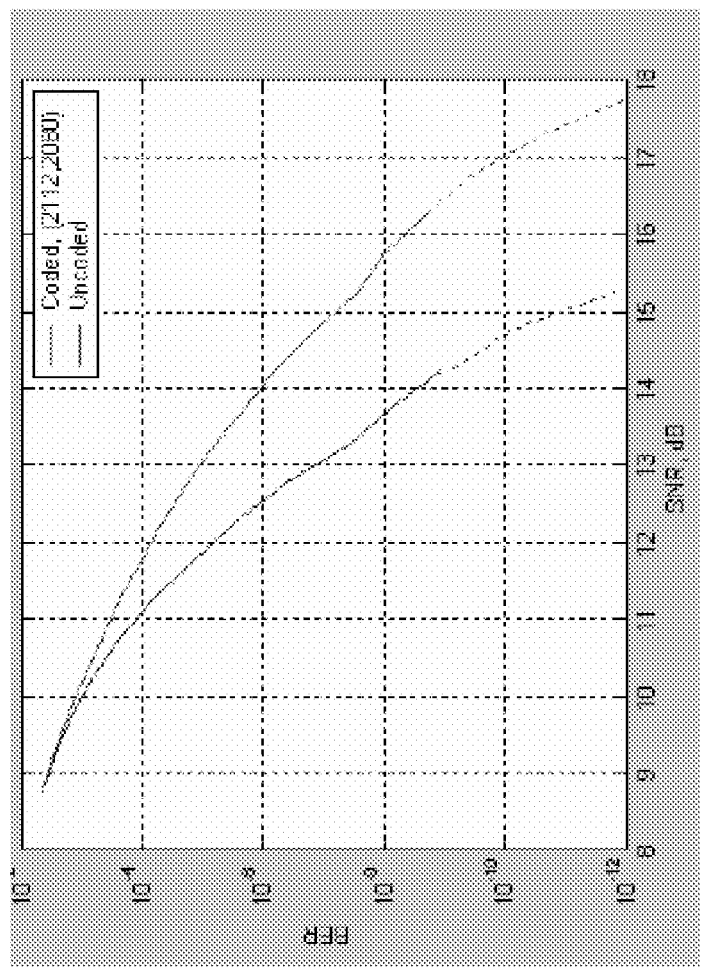
FIG. 18 illustrates one embodiment of a sixth graph.
Figure 19:
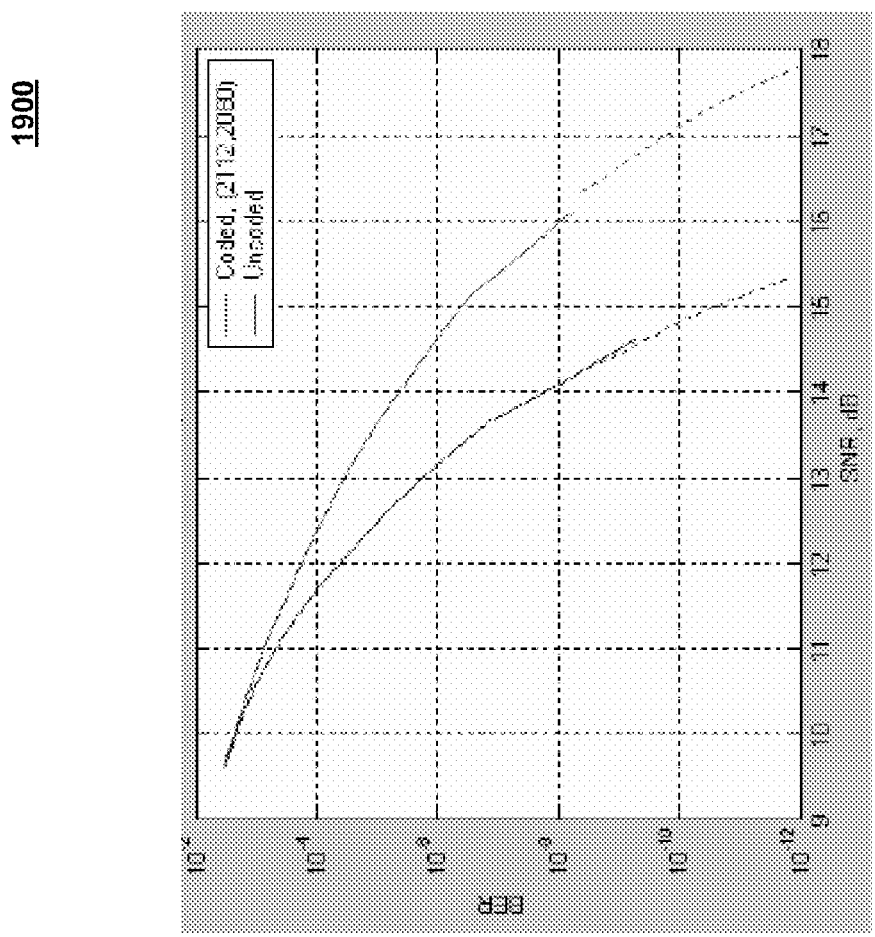
FIG. 19 illustrates one embodiment of a seventh graph.

FIGS. 18-19 may illustrate various simulations related to backplanes made by Molex®. FIGS. 18-19 may illustrate graphs 1800 and 1900, respectively. Graphs 1800, 1900 may be used to compare a BER of the (2112, 2080) code and uncoded transmission for various backplane test channels of Inbound J4K4G4H4 and Outbound J3K3G3H3. SNR is equal to the SNR at a slicer with simulations to BER of $10^{-8}/10^{-9}$ and extrapolated to $10^{-12}$. Graphs 1600, 1700 indicate that simulations also show an approximate 2 dB coding gain at a BER of $10^{-9}$, for example.

As shown in graphs 1300-1900, the (2112, 2080) code enables serial communications over channels that may not operate with traditional non-return-to-zero (NRZ) or 8b/10b or 64/66b encoding by providing an additional 2 dB or more of equivalent SNR gain over data that was not coded using this technique. The code requires reduced overhead at the transmitter and uses the same transmit rate as the 64/66b code. The encoding and decoding algorithms have a relatively lower complexity and can be implemented in silicon with less than approximately 50,000 gates.

The (2112, 2080) codes may have several advantages over previous techniques. For example, the code may achieve approximately 2 dB or more of SNR gain over NRZ with 8b/10b or 64/66b encoded signals. In another example, the code can detect and correct error bursts up to 11 bits in length induced by, for example, the communication channel. In yet another example, the code may use the same transmit overhead as the 64/66b code for 10 Gbps communications and uses the same encode boundaries. In still another example, the code provides for lower latency at the receiver to decode and correct the errors, with a latency of only 2112 bits or approximately 200 nanoseconds (ns) at 10 Gbps data rates. In yet another example, the code allows high speed serial communication (e.g., 10 Gbps or above) to operate over channels which are mass manufactured using FR-4 and standard high volume manufacturing techniques, and also provides additional margin to account for variations in manufacturing and environmental conditions. In still another example, the code is readily adaptable to other standards or encoding schemes. The code can be adapted to work with 64/66b code to provide another layer of error correction capability, and can also be used in any high speed serial network architecture, including Ethernet architectures, Infiniband architectures, FibreChannel architectures, PCI-Express architectures, and so forth. The embodiments are not limited in this context.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is also worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

Some embodiments may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a general-purpose or special-purpose processor. In another example, an embodiment may be implemented as dedicated hardware. In yet another example, an embodiment may be implemented by any combination of programmed general-purpose computer components and custom hardware components. The embodiments are not limited in this context.

Various embodiments may be implemented using one or more hardware elements. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. The embodiments are not limited in this context.

Various embodiments may be implemented using one or more software elements. In general, a software element may refer to any software structures arranged to perform certain operations. In one embodiment, for example, the software elements may include program instructions and/or data adapted for execution by a hardware element, such as a processor. Program instructions may include an organized list of commands comprising words, values or symbols arranged in a predetermined syntax, that when executed, may cause a processor to perform a corresponding set of operations. The software may be written or coded using a programming language. Examples of programming languages may include C, C++, BASIC, Perl, Matlab, Pascal, Visual BASIC, JAVA, ActiveX, assembly language, machine code, and so forth. The software may be stored using any type of computer-readable media or machine-readable media. Furthermore, the software may be stored on the media as source code or object code. The software may also be stored on the media as compressed and/or encrypted data. Examples of software may include any software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. The embodiments are not limited in this context.

Some embodiments may be described using the expression "coupled" and "connected" along with their derivatives. It should be understood that these terms are not intended as synonyms for each other. For example, some embodiments may be described using the term "connected" to indicate that two or more elements are in direct physical or electrical contact with each other. In another example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

Some embodiments may be implemented, for example, using a machine-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Rewriteable (CD-RW), optical disk, magnetic media, magneto-optical media, removable memory cards or disks, various types of Digital Versatile Disk (DVD), a tape, a cassette, or the like. The instructions may include any suitable type of code, such as source code, compiled code, interpreted code, executable code, static code, dynamic code, and the like. The instructions may be implemented using any suitable high-level, low-level, object-oriented, visual, compiled and/or interpreted programming language, such as C, C++, Java, BASIC, Perl, Matlab, Pascal, Visual BASIC, assembly language, machine code, and so forth. The embodiments are not limited in this context.

Unless specifically stated otherwise, it may be appreciated that terms such as "processing," "computing," "calculating," "determining," or the like, refer to the action and/or processes of a computer or computing system, or similar electronic computing device, that manipulates and/or transforms data represented as physical quantities (e.g., electronic) within the computing system's registers and/or memories into other data similarly represented as physical quantities within the computing system's memories, registers or other such information storage, transmission or display devices. The embodiments are not limited in this context.

While certain features of the embodiments have been illustrated as described herein, many modifications, substitutions, changes and equivalents will now occur to those skilled in the art. It is therefore to be understood that the appended claims are intended to cover all such modifications and changes as fall within the true spirit of the embodiments.

The invention claimed is:

1. An apparatus, comprising:
a physical layer unit having a forward error correction (FEC) sublayer to perform FEC using a transcode bit to represent a two bit synchronization header, said FEC sublayer having an FEC encoder to encode a physical coding sublayer (PCS) block by compressing said two bit synchronization header into said transcode bit, and to use one bit of the two bit synchronization header in the PCS block to send parity information, the parity information and transcode bit to be placed in an FEC block prior to transmission of the FEC block over a physical medium.

2. The apparatus of claim 1, wherein the FEC block has 2112 bits including 32 parity bits and 32 65-bit blocks with each 65-bit block including one transcode bit.

3. The apparatus of claim 2, wherein the 32 parity bits are placed at the end of the FEC block.

4. The apparatus of claim 1, wherein the FEC sublayer further comprising:
a reverse gearbox;
a compressor to couple to said reverse gearbox;
a selector to couple to said compressor;
a parity generator to couple to said compressor;
a multiplexer to couple to said compressor, selector and said parity generator;
a scrambler to couple to said multiplexer; and
a pseudo-noise generator to couple to said scrambler.

5. The apparatus of claim 1, wherein the PCS block has 66 bits including the two bit synchronization header.

6. The apparatus of claim 1, wherein the value of the transcode bit corresponds to the value of a second bit in the two bit synchronization header.

7. The apparatus of claim 1, comprising a forward error correction decoder and
block synchronizer to decode a physical coding sublayer block of information by reconstructing said two bit synchronization header using said single bit.

8. The apparatus of claim 1, comprising a forward error correction decoder and block synchronizer to comprise:
a descrambler;
a pseudo-noise generator to couple to said descrambler;
a synchronizer to couple to said descrambler; a decoder to couple to said synchronizer; an error monitor to couple to said decoder; and
a reconstructor to couple to said decoder.

9. A method comprising
performing forward error correction (FEC) using a transcode bit to represent a two bit synchronization header, said performing comprising:
encoding a physical coding sublayer (PCS) block of information by compressing said two bit synchronization header into said transcode bit;
using one bit of the two bit synchronization header in the PCS block to send parity information; and
placing said transcode bit and said parity information in an FEC block prior to transmission of the FEC block over a physical medium.

10. The method of claim 9, wherein the PCS block has 66 bits including the two bit synchronization header.

11. The method of claim 9, wherein the value of the transcode bit corresponds to the value of a second bit in the two bit synchronization header.

12. The method of claim 9, comprising:
receiving PCS blocks of information;
compressing two synchronization bits from each PCS block to a transcode bit; and
generating the forward error correction block using said PCS blocks and said parity information.

13. The method of claim 12, wherein the FEC block has 2112 bits including 32 parity bits and 32 65-bit blocks with each 65-bit block including one transcode bit.

14. The method of claim 13, wherein the 32 parity bits are placed at the end of the FEC block.

15. The method of claim 12, wherein the FEC block has 2112 bits including 32 parity bits and 32 65-bit blocks with each 65-bit block including one transcode bit.

16. The method of claim 9, comprising:
decoding a physical medium attachment (PMA) sublayer block of information by reconstructing said two bit synchronization header using said transcode bit.

17. The method of claim 9, comprising:
receiving physical medium attachment (PMA) sublayer blocks of information;
decoding each PMA block;
retrieving parity check bits for said PMA sublayer blocks; and
performing forward error correction using said parity check bits.

18. An article comprising a machine-readable storage medium containing instructions that if executed enable a system to
perform forward error correction (FEC) using a transcode bit to represent a two bit synchronization header by:
encoding a physical coding sublayer (PCS) block of information by compressing said two bit synchronization header into said transcode bit;

using one bit of the two bit synchronization header in the PCS block to send parity information; and placing said transcode bit and said parity information in an FEC block prior to transmission of the FEC block over a physical medium.

19. The article of claim 18, wherein the value of the transcode bit corresponds to the value of a second bit in the two bit synchronization header.

* * * * *